(12) United States Patent  
Duff

(10) Patent No.: US 8,924,910 B2  
(45) Date of Patent: Dec. 30, 2014

(54) FILTER DESIGN TOOL

(71) Applicant: Analog Devices, Inc., Norwood, MA (US)

(72) Inventor: Matthew N. Duff, Longmont, CO (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/673,912

(22) Filed: Nov. 9, 2012

(65) Prior Publication Data

US 2014/0137067 A1 May 15, 2014

(51) Int. Cl.
*G06F 17/50* (2006.01)
*H03H 11/12* (2006.01)

(52) U.S. Cl.
CPC ....... *G06F 17/5063* (2013.01); *H03H 11/1221* (2013.01); *H03H 11/1265* (2013.01)
USPC ...................................... 716/132

(58) Field of Classification Search
CPC ................................. G06F 17/5063
USPC ................................. 716/100, 132
See application file for complete search history.

(56) References Cited

U.S. PATENT DOCUMENTS

| | | | | |
|---|---|---|---|---|
| 7,231,614 | B2 * | 6/2007 | Best et al. .................. | 716/103 |
| 8,806,409 | B2 | 8/2014 | Duff | |
| 2003/0161420 | A1 * | 8/2003 | Pupalaikis .................. | 375/346 |
| 2004/0044970 | A1 * | 3/2004 | Anderson et al. ................. | 716/1 |
| 2005/0260949 | A1 | 11/2005 | Kiss et al. | |
| 2006/0164159 | A1 | 7/2006 | Kimura | |
| 2009/0326682 | A1 * | 12/2009 | Junk et al. ..................... | 700/65 |
| 2010/0325599 | A1 * | 12/2010 | Perry et al. .................... | 716/122 |
| 2011/0119320 | A1 | 5/2011 | Wu et al. | |
| 2012/0075012 | A1 * | 3/2012 | Bailey et al. .................. | 327/553 |
| 2012/0112825 | A1 * | 5/2012 | Engler et al. .................. | 327/552 |
| 2012/0194265 | A1 * | 8/2012 | Katsube et al. ............... | 327/554 |
| 2013/0027134 | A1 | 1/2013 | Zhu | |
| 2013/0195287 | A1 * | 8/2013 | Christoph ...................... | 381/98 |
| 2014/0012888 | A1 * | 1/2014 | Bailey et al. .................. | 708/313 |
| 2014/0137068 | A1 | 5/2014 | Duff | |
| 2014/0137069 | A1 | 5/2014 | Duff | |

FOREIGN PATENT DOCUMENTS

EP 1400904 A2 3/2004

OTHER PUBLICATIONS

U.S. Appl. No. 13/706,928, filed Dec. 6, 2012, entitled "Filter Design Tool," Inventor: Matthew N. Duff.
U.S. Appl. No. 13/711,038, filed Dec. 11, 2012, entitled "Filter Design Tool," Inventor: Matthew N. Duff, et al.

(Continued)

*Primary Examiner* — Suchin Parihar
(74) *Attorney, Agent, or Firm* — Patent Capital Group

(57) ABSTRACT

A method according to an embodiment of a filter design tool is provided and includes receiving filter parameters for an analog filter through a user interface, where the filter parameters include an optimization parameter related to an application requirement of the analog filter, optimizing the filter for the optimization parameter, calculating a design output based on the optimized filter, and displaying the design output on the user interface. The method can further include receiving viewing parameters that specify the design output to be displayed. In various embodiments, the user interface includes an input area, a viewing area and a window area in one or more pages, where the input area is contiguous to the viewing area in at least one page. The filter parameters can be entered in the input area and the design output is calculated and displayed in the contiguous viewing area substantially immediately.

14 Claims, 37 Drawing Sheets

(56) References Cited

OTHER PUBLICATIONS

"Filter Wiz Pro Active Filter Designer Version 5," Schematica, © 2012 Schematica Software http://www.schematica.com/active_filters/fwpro.html; 10 pages.

"FilterPro User's Guide, High Performance Analog," Texas Instruments, SBFA001C—Jun. 1991—Revised Feb. 2011; © 1991-2011 Texas Instruments Incorporated; 39 pages.

"Microchip FilterLab 2.0 User's Guide," DS51419A, © 2003 Microchip Technology; 76 pages.

"WEBENCH Designer," © Copyright 1995-2012 Texas Instruments Incorporated; 21 pages [Retrieved and printed Feb. 28, 2012] http://www.ti.com/ww/en/analog/webench/help/index.shtml.

Carter, Bruce "Chapter 10—Op Amp Noise Theory and Applications" (Literature No. SLOA082) excerpted from *Op Amps for Everyone* (Literature No. SLOD006A), © 2008 Texas Instruments Incorporated; 26 pages.

Steffes, Michael, "iSIM Active Filter Designer," intersil, Dec. 15, 2010; 35 pages.

Zumbahlen, Hank, "Using the Analog Devices Active Filter Design Tool," AN-649 Application Note, Analog Devices, © 2003 Analog Devices, Inc.; 28 pages.

Zumbahlen, Hank, Ed., "Chapter 8 Analog Filters," *Linear Circuit Design Handbook*, Feb. 2008, ISBN 978-0-7506-8703-4; 148 pages.

Notice of Allowance in U.S. Appl. No. 13/706,928 mailed on Apr. 14, 2014.

Non-Final Office Action in U.S. Appl. No. 13/711,038 mailed Mar. 20, 2014.

Notice of Allowance in U.S. Appl. No. 13/711,038 mailed Sep. 9, 2014, 9 pages.

\* cited by examiner

|  | MINIMUM | MAXIMUM |
|---|---|---|
| GAIN | 0 dB<br>1 V/V | 40 dB<br>100 V/V |
| PASSBAND ATTENUATION | -.1 dB | -20 dB |
| PASSBAND FREQUENCY | 1 Hz | 10 MHz |
| RIPPLE | 0 dB | 20 dB |
| STOPBAND ATTENUATION | -1 dB | -100 dB |
| STOPBAND FREQUENCY | 1 Hz | 100 MHz |

|  | MINIMUM | MAXIMUM |
|---|---|---|
| GAIN | 0 dB<br>1 V/V | 40 dB<br>100 V/V |
| PASSBAND ATTENUATION | -.1 dB | -20 dB |
| PASSBAND FREQUENCY | 0.01 Hz | 1 MHz |
| RIPPLE | 0 dB | 20 dB |
| STOPBAND ATTENUATION | -1 dB | -100 dB |
| STOPBAND FREQUENCY | 0.001 Hz | 1 MHz |

| | MINIMUM | MAXIMUM |
|---|---|---|
| GAIN | 0 dB<br>1 V/V | 40 dB<br>100 V/V |
| CENTER FREQUENCY | 0.1 Hz | 10 MHz |
| PASSBAND ATTENUATION | -.1 dB | -20 dB |
| PASSBAND BANDWIDTH | 0.01 Hz | 1 MHz |
| RIPPLE | 0 dB | 20 dB |
| STOPBAND ATTENUATION | -1 dB | -100 dB |
| STOPBAND BANDWIDTH | 1 Hz | 100 MHz |

| | MINIMUM | MAXIMUM |
|---|---|---|
| GAIN | 0 dB<br>1 V/V | 40 dB<br>100 V/V |
| CENTER FREQUENCY | 1 Hz | 1 MHz |
| PASSBAND ATTENUATION | -.1 dB | -20 dB |
| PASSBAND BANDWIDTH | 1 Hz | 10 MHz |
| RIPPLE | 0 dB | 20 dB |
| STOPBAND ATTENUATION | -1 dB | -100 dB |
| STOPBAND BANDWIDTH | 0.01 Hz | 1 MHz |

FIG. 9

|  | LOW-PASS | HIGH-PASS | BAND-PASS | BAND-STOP |
|---|---|---|---|---|
| GAIN | 1 | 1 | 1 | 1 |
| GAIN UNITS SETTING | dB | dB | dB | dB |
| PASSBAND ATTENUATION | -3 | -3 | -3 | -3 |
| PASSBAND FREQUENCY (BANDWIDTH) | 1k | 1k | 500 | 15 |
| PASSBAND RIPPLE | GREYED OUT | GREYED OUT | GREYED OUT | GREYED OUT |
| STOPBAND ATTENUATION | -40 | -40 | -40 | -40 |
| STOPBAND FREQUENCY (BANDWIDTH) | 4k | 250 | 4k | 100m |
| FILTER RESPONSE | MIDDLE SETTING (BUTTERWORTH) | MIDDLE SETTING (BUTTERWORTH) | MIDDLE SETTING (BUTTERWORTH) | GREYED OUT MIDDLE SETTING |
| CENTER FREQUENCY | NA | NA | 1k | 60 |

Active Filter Wizard http://www.analog.com/filterwizard.html

| Type | Specifications | Component Selection | Component Tolerances | Final Results |

Select Op Amp for Stage 1

| Port | | | | |
|---|---|---|---|---|
| Filter | GBW (Hz) | Supply Min (V) | Supply Max (V) | comments |
| | > | > | < | Show All |
| OP132 | 15MHz | 2.7V | 12V | disabled: higher supply voltage needed |
| OP177 | 600KHz | 6V | 44V | recommended |
| OP183 | 5MHz | 5V | 36V | recommended |
| OP184 | 4.25MHz | 3V | 36V | recommended |
| OP191 | 3MHz | 2.7V | 12V | disabled: higher supply voltage needed |
| OP193 | 35MHz | 1.7V | 36V | recommended |
| OP196 | 450KHz | 3V | 12V | marginal: GBW low |
| OP200 | 500KHz | 6V | 40V | disabled: higher supply voltage needed |
| OP213 | 3.4MHz | 4V | 36V | recommended |
| OP2177 | 1.3MHz | 5V | 36V | recommended |
| OP249 | 4.7MHz | 9V | 36V | recommended |
| OP282 | 15MHz | 2.7V | 12V | disabled: higher supply voltage needed |
| OP27 | 8MHz | 8V | 44V | recommended |
| OP270 | 5MHz | 9V | 36V | recommended |
| OP275 | 9MHz | 9V | 44V | recommended |

Stage 1 op amp requirements: total supply voltage = 24V
required GBW > 8 kHz
recommended GBW > 160 kHz ── 138

18

134 ── Select

136 ── Cancel

Active Filter Wizard http://www.analog.com/filterwizard.html

Save to myAnalog

Specifications | Component Selection | Component Tolerances | Final Results

Order Eval Board

Stage information:

| Stage | Stage Information | | |
|---|---|---|---|
| | Support Components | Eval Board Needed | Parts on this Eval Board |
| 1 | Gain | EVAL-FILTWIZ-BASE | R1R, R2R, C1R, C8R, U1R |
| 2 | Sallen Key Low Pass | EVAL-FILTWIZ-SK1 | R1A, R2A, U1A, C8A |
| 3 | First Order Low Pass | EVAL-FILTWIZ-SK2 | R1B, R2B, R3B, R4B, C1B, C2B, C8B, U1B |
| | | EVAL-FILTWIZ-SK2 | R1C, C1C, C8C, U1C |

Eval Board Ordering information:

| Quantity | Eval Board | Description | Price (Each) | In Stock? |
|---|---|---|---|---|
| 1 | EVAL-FILTWIZ-BASE | Base Board for Filter Wizard Circuit and Reference Circuitry | $20 | ☑ |
| 2 | EVAL-FILTWIZ-SK1 | Single Op Amp Filter Wizard Eval board for: Gain, Sallen Key Low Pass, First Order Low Pass | $10 | ☑ |
| 3 | EVAL-FILTWIZ-SK2 | Dual Op Amp Filter Wizard Eval board for: Gain, Sallen Key Low Pass, First Order Low Pass | $10 | ☑ |

Cancel | Order

FIND THE MINIMUM NATURAL FREQUENCY OF ALL STAGES IN THE FILTER;
THE STARTING RESISTOR VALUE IS DETERMINED BY A COMBINATION THE MINIMUM NATURAL FREQUENCY AND THE OPTIMIZATION USING THE FOLLOWING ALGORITHM:
STARTING RESISTOR VALUE = X / sqrt(fp),
WHERE X = MINIMUM (sqrt(fmax)*Rmin, Rmax)
WHERE fmax, Rmin, AND Rmax DEPEND ON THE OPTIMIZATION AS SHOWN IN THE FOLLOWING TABLE:

| | fmax | Rmin | Rmax |
|---|---|---|---|
| OPTIMIZE FOR NOISE | 10 MHz | 100Ω | 10kΩ |
| OPTIMIZE FOR VOLTAGE RANGE | 10 MHz | sqrt(100k Ω2) | 100kΩ |
| OPTIMIZE FOR POWER | 10 MHz | 1000Ω | 1MΩ |

FIG. 25

FOR EACH STAGE FIGURE OUT THE MINIMUM GBW, MINIMUM SLEW RATE, AND MAXIMUM Rout/GBW ALLOWED.
MINIMUM OP AMP GBW = MAXIMUM (GBW FROM ALL STAGES)
MAXIMUM ROUT OVER GBW = MINIMUM (RoutOverGBW FROM ALL STAGES)
MINIMUM SLEW RATE = MAXIMUM (SLEW RATE FROM ALL STAGES)

FIG. 26

```
GET ALL OP AMPS FROM DATABASE THAT MEET minGBW < opamp.GBW <= 10*minGBW
FROM THIS LIST, REMOVE ANY ELEMENTS WHERE OP AMP NOT ALLOWED? == TRUE;
IF NO OP AMPS MEET CRITERIA, MULTIPLY BY minGBW BY 10 AND REPEAT UNTIL AT LEAST ONE OP AMP MEETS THE CRITERIA OR
minGBW EXCEEDS 10 GHz.
IF minGBW REACHES 10 GHz WITH NO OP AMP MEETING THE CRITERIA,
{
    NOTIFY USER THAT NO OP AMP CAN BE FOUND TO MEET DESIGN PARAMETERS.
    IF (+Vs - -Vs < 5V) or (+Vs - -Vs > 10V)
    SUGGEST TO USER THAT SETTING +Vs TO 5V AND -Vs TO 0V OR -5V MAY YIELD BETTER RESULTS
}
IF AT LEAST ONE OP AMP FOUND, THEN FROM THE REMAINING LIST:
{
    IF OPTIMIZATION == POWER, CHOOSE OP AMP FROM LIST WITH LOWEST opamp.SupplyCurrent
    IF OPTIMIZATION == NOISE
    {
        GET R3plusR4 USING SMALLEST FP VALUE FROM THE ARRAY OF STAGE SPECIFICATIONS FOR EACH OP AMP
          ON THE LIST;
        NOISE = sqrt((opamp.Vnoise)^2 + (R3plusR4 * opamp.Inoise)^2);
        PICK OP AMP FROM LIST WITH LOWEST NOISE
    }
    IF OPTIMIZATION == VOLTAGE RANGE,
    {
        TotalGain = MULTIPLY GAIN OF ALL STAGES TOGETHER FOR EACH OP AMP IN THE LIST
        {
            OP AMP VOLTAGE ROOM
            ROOM = MIN (InRoom, OutRoom/TotalGain);
        }
        CHOOSE OP AMP FROM LIST WITH BIGGEST ROOM
    }
}
```

```
If (-Vs ==0)
{
        RefV = +Vs/2;
}
else
{
        RefV = 0;
}
InMax = +Vs - opamp.InputHeadroomV+;
InMin = -Vs + opamp.InputHeadroomV-;
OutMax = +Vs - opamp.OutputHeadroomV+;
OutMin = -Vs + opamp.OutputHeadroomV+;
PosInRoom = InMax - RefV;
PosOutRoom = OutMax - RefV;
NegInRoom = RefV - InMin;
NegOutRoom = RefV - OutMin;
InRoom = Min(PosInRoom, NegInRoom);
OutRoom = Min(PosOutRoom, NegOutRoom);
```
322

FIG. 29

334 fmax = 10 MHz;
SET R AT fmax and Rmax BASED ON OPTIMIZATION, USING TABLE BELOW:

| OPTIMIZATION | R at fmax | Rmax |
|---|---|---|
| NOISE | 100 | 10k |
| VOLTAGE RANGE | sqrt(100,000) | 100k |
| POWER | 1000 | 1M |
| SPECIFIC COMPONENTS | sqrt(100,000) | 100k |

336

Rfreq = sqrt( fmax/fp ) * R at fmax;
R3plusR4 = MINIMUM (Rfreq, Rmax);

1) C1 = DETERMINE STARTING CAPACITOR VALUE BASED ON STAGE'S FP AND USER'S OPTIMIZATION CHOICE;
2) R3plusR4 = DETERMINE STARTING R3+R4 VALUE BASED ON STAGE'S FP AND USER'S OPTIMIZATION CHOICE;
3) POPULATE ALL OP AMP FIELDS IN COMPONENT VALUES DATABASE BY PULLING VALUES FROM OP AMP DATABASE.
IF Rout DOES NOT EXIST IN DATABASE, USE 0.3/SUPPLY CURRENT INSTEAD;
4) LoopFp = FP FROM TARGET STAGE SPECS, LoopQ = Q FROM TARGET STAGE SPECS;
IF "COMPENSATE FOR OP AMP" IS CHECKED, RUN THE FOLLOWING IN A LOOP FOUR TIMES,
OTHERWISE JUST DO IT ONCE:
{
    If filter is 1st order low pass,
    {
        populate non-op amp fields in the Component Object using first order ideal op amp;
    }
    If filter is ist order high pass,
    {
        populate non-op amp fields in the Component Object using first order ideal op amp;
    }
    If filter is 2nd order low pass,
    {
        populate non-op amp fields in the Component Object using Sallen Key Low Pass
        ideal op amp;
    }
    If filter is 2nd order high pass,
    {
        populate non-op amp fields in the Component Object using Sallen Key High Pass
        ideal op amp;
    }
    If filter is 2nd order bandpass,
    {
        populate non-op amp fields in the Component Object using Delyiannis Friend
        Bandpass ideal op amp;
    }
    If filter is 2nd order bandstop,
    {
        populate non-op amp fields in the Component Object using Delyiammis Friend Notch
        ideal op amp;
    }
    Impose component values limits
    if (stage type != gain)
    {
        Get ActualFp and ActualQ
        LoopFp = (Fp/ActualFp) * LoopFp;
        LoopQ = (Q/ActualQ) * LoopQ;
    }
}
5) POPULATE ACTUAL STAGE SPECIFICATIONS:
    fp = ActualFp;
    Q = ActualQ;
    fz = fz FROM TARGET STAGE SPECS;
    GAIN = GAIN FROM TARGET STAGE SPECS;
    ORDER = ORDER FROM TARGET STAGE SPECS;
    TYPE = TYPE FROM TARGET STAGE SPECS;

FIG. 30

OPTIMIZE FOR POWER

| FP | CAPACITOR |
|---|---|
| BELOW 1.59 Hz | 1/(2*PI*fp* 1 Mohm) |
| 1.59 Hz to 15.9 Hz | 100 nF |
| 15.9 Hz to 1.59 kHz | 1/(2*PI*fp* 100kohm) |
| 1.59 kHz to 15.9 kHz | 1 nF |
| ABOVE 15.9 kHz | 1/(2*PI*fp*10 kohm) |

← 326

OPTIMIZE FOR VOLTAGE RANGE

| FP | CAPACITOR |
|---|---|
| BELOW 15.9 Hz | 1/(2*PI*fp* 100kohm) |
| 15.9 Hz to 159 Hz | 100 nF |
| 159 Hz to 15.9 kHz | 1/(2*PI*fp* 10kohm) |
| 15.9 kHz to 159 kHz | 1 nF |
| ABOVE 159 kHz | 1/(2*PI*fp*1 kohm) |

← 328

OPTIMIZE FOR NOISE

| FP | CAPACITOR |
|---|---|
| BELOW 159 Hz | 1/(2*PI*fp* 10kohm) |
| 159 Hz to 1.59 Hz | 100 nF |
| 1.59 kHz to 159 kHz | 1/(2*PI*fp* 1kohm) |
| 159 kHz to 1.59 MHz | 1 nF |
| ABOVE 1.59 MHz | 1/(2*PI*fp*100 ohms) |

```
numfreqpoints = 50;
Compute frequency range
{
        start frequency = fstart from typical frequency range,
        stop frequency = fstop from typical frequency range,
        points per decade = numfreqpoints * log (fstop from typical frequency range
}
If (Optimization == Noise)
{
        for j = each component stage permutation
        {
                Calculate Spectral Density
                RMSnoise[j] = Calculate RMS & Peak to Peak Values, with ADC bandwidth =
                max frequency in the frequency array
        }
        return new component array, new target stage specs, and new actual stage specs
        rearranged in the order that gives the smallest RMSnoise
}
If (Optimization == VoltageRange)
{
        for j = each component stage permutation
        {
                multiplier[j] = multiplier calculated in Voltage Range
        }
        return new component array, new target stage specs, and new actual stage specs
        rearranged in the order that gives the largest multiplier
}
```

FIG. 33

FILTER DESIGN TOOL

TECHNICAL FIELD

This disclosure relates in general to the field of circuit design and, more particularly, to a filter design tool.

BACKGROUND

The process of circuit design can cover systems ranging from complex electronic systems to individual transistors within an integrated circuit. Formal circuit design usually includes generating a specification based on customer application, synthesizing a schematic circuit diagram for the specifications, calculating component values to meet the specifications under specified conditions, performing simulations to verify the design, building a prototype and testing against the specification, and other steps that can facilitate manufacturing the circuit appropriately. Circuits can often be designed by one or more circuit designers following a systematic approach with intelligently guided computer simulation. Such computer simulation tools can facilitate efficient and accurate design of circuits, both simple and complex, including analog and digital filters.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 4A, 4B and 4C are simplified diagrams illustrating yet other example screen shots associated with an embodiment of the filter design tool;

FIG. 5 is a simplified diagram illustrating example details of the filter design tool in accordance with one embodiment;

FIG. 6 is a simplified diagram illustrating further example details of the filter design tool in accordance with one embodiment;

FIG. 7 is a simplified diagram illustrating further example details of the filter design tool in accordance with one embodiment;

FIG. 8 is a simplified diagram illustrating further example details of the filter design tool according to an embodiment;

FIG. 9 is a simplified diagram illustrating further example details of the filter design tool according to an embodiment;

FIGS. 11A and 11B are simplified diagrams illustrating yet other example screen shots associated with an embodiment of the filter design tool;

FIGS. 12A, 12B and 12C are simplified diagrams illustrating yet other example screen shots associated with an embodiment of the filter design tool;

FIGS. 16A and 16B are simplified diagrams illustrating yet other example screen shots associated with an embodiment of the filter design tool;

FIG. 17 is a simplified diagram illustrating yet another example screen shot associated with an embodiment of the filter design tool;

FIG. 20 is a simplified diagram illustrating yet another example screen shot associated with an embodiment of the filter design tool;

FIG. 25 is a simplified pseudo-code illustrating yet other example operations that may be associated with an embodiment of the filter design tool;

FIG. 26 is a simplified pseudo-code illustrating yet other example operations that may be associated with an embodiment of the filter design tool;

FIG. 28 is a simplified pseudo-code illustrating yet other example operations that may be associated with an embodiment of the filter design tool;

FIG. 29 is a simplified pseudo-code illustrating yet other example operations that may be associated with an embodiment of the filter design tool;

FIG. 30 is a simplified pseudo-code illustrating yet other example operations that may be associated with an embodiment of the filter design tool;

FIG. 31 is a simplified diagram illustrating example details of an embodiment of the filter design tool;

FIG. 32 is a simplified pseudo-code illustrating yet other example operations that may be associated with an embodiment of the filter design tool;

FIG. 33 is a simplified pseudo-code illustrating yet other example operations that may be associated with an embodiment of the filter design tool;

DETAILED DESCRIPTION OF EXAMPLE EMBODIMENTS

Overview

A method according to an embodiment of a filter design tool is provided and includes receiving filter parameters for an analog filter through a user interface, where the filter parameters include an optimization parameter related to an application requirement of the analog filter, optimizing the filter for the optimization parameter, calculating a design output based on the optimized filter, and displaying the design output on the user interface. The method can further include receiving viewing parameters through the user interface, where the viewing parameters specify the design output to be displayed. In various embodiments, the user interface includes an input area, a viewing area, and a window area in a plurality of pages, where the input area is contiguous to the viewing area in at least one page. The filter parameters can be entered in the input area and the design output is calculated and displayed in the contiguous viewing area substantially immediately.

The filter parameters can include a type of filter, a filter response type, and corresponding plurality of performance constraints, voltage supplies for operational amplifiers (op amps) in the filter, and component tolerances. In a specific embodiment, the filter response type can be specified through a slider control having at least three selectable points corresponding to three different filter response types. The viewing parameters can include magnitude of a frequency response of the filter, phase of the frequency response, step response of the filter, and other parameters.

In a specific embodiment, the user interface is configured to be navigable across the one or more pages according to a filter design process, including selecting a filter type, selecting performance constraints and a filter response type, specifying the optimization parameter and specifying component tolerances. When a page indicating a step in the filter design process is displayed as an active page in the user interface, one of the pages indicating a previous step in the filter design process can be selected to be rendered the active page, but pages indicating subsequent steps in the filter design process cannot be selected to be rendered the active page before completing the step in the currently active page. The method includes other features in various embodiments.

Example Embodiments

Figure 1:
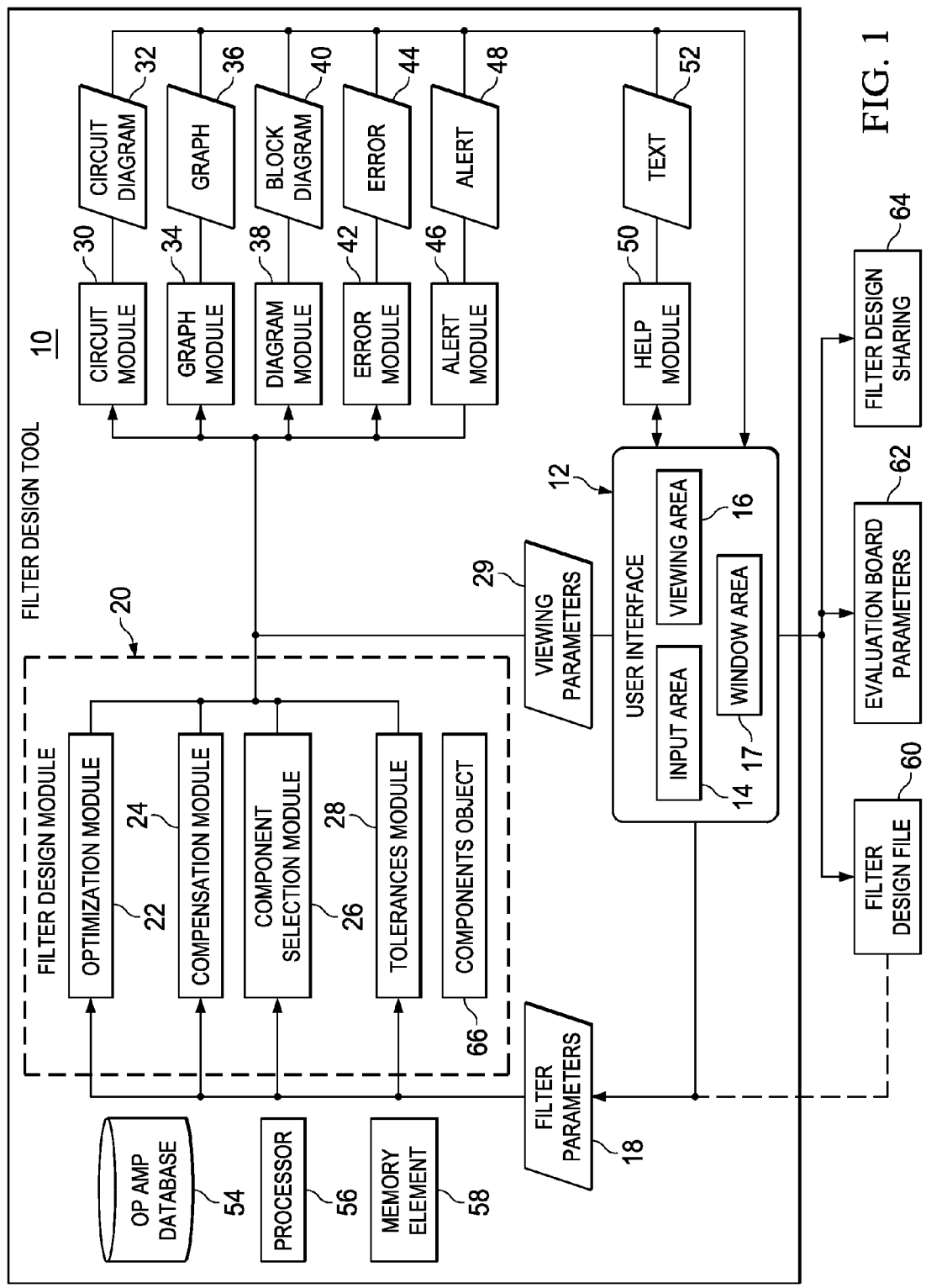
FIG. 1 is a simplified block diagram illustrating an example embodiment of a filter design tool.

Turning to FIG. 1, FIG. 1 is a simplified block diagram illustrating a filter design tool 10. Filter design tool 10 includes a user interface 12 that has an input area 14, a viewing area 16, and a window area 17. Input area 14 may include any portion of user interface 12 that allows a user to enter (or manipulate) entries associated with the filter; viewing area 16 may include any portion of user interface 12 that displays a design output; and window area 17 may include any portion of user interface 12 that is not input area 14 or viewing area 16, and that opens (e.g., pops up, or is otherwise rendered active) based on the user's interaction with user interface 12.

In various embodiments, input area 14 and viewing area 16 may be visible simultaneously to a user viewing user interface 12, and window area 17 may appear occasionally, and overlap input area 14 and/or viewing area 16. The user may specify various filter parameters 18 that may be related to an application of the user. For example, filter parameters 18 may specify that the filter to be designed has low noise, or low power consumption, or large voltage range, etc.

Filter parameters 18 may be fed to a filter design module 20. An optimization module 22 may optimize the filter for certain optimization parameters according to filter parameters 18. As used herein, the term "optimize" includes any process, act, operation, method of designing (e.g., creating, configuring, generation, arranging, organizing, building up, selecting, constructing, etc.) a filter circuit. Such a filter circuit could provide a more effective filter performance for the specified optimization parameter compared to a plurality of other possible configurations.

For example, optimizing the filter for noise includes generating a suitable filter configuration with suitable resistors, capacitors, and op amps connected together in an appropriate manner such that the filter has the lowest noise among a plurality of possible configurations. In another example, optimizing the filter for power includes generating a suitable filter configuration that has the lowest power consumption among a plurality of other configurations. In yet another example, optimizing the filter for voltage range includes generating a suitable filter configuration that has the largest voltage range among a plurality of other possible configurations. The term optimize, as used herein, does not necessarily indicate making (or designing, creating, etc.) a fully perfect, fully functional, optimal, exemplary, or most effective filter.

In mathematical terms, optimization can be specified as minimizing an objective function f(x), where x indicates a set of optimization parameters (that may or may not have upper and lower bounds, such as $x_L \le x \le x_U$), subject to certain linear and/or nonlinear constraints. In various embodiments, optimization parameters in filter design tool 10 include parameters related to application requirements of analog filters that could be also related to circuit topology and performance of the analog filters, including parameters such as noise, power, voltage range, choice of specific components, price, size, Direct Current (DC) accuracy, component count, and temperature range.

"Application requirement" as used herein refers to any performance specification, preference, designation, configuration setting, or characteristic of the analog filter. This could apply to a particular application in which the analog filter is used. For example, it may be desirable for analog filters used in digital subscriber line applications to have low noise; analog filters used in certain audio applications should operate on low power; analog filters used in some music synthesizers should have large voltage ranges; analog filters used in space or military applications should have reliable operation over large temperate ranges; etc. Any suitable optimization parameter associated with application requirements of analog filters may be chosen within the broad scope of the embodiments.

The set of optimization parameters can specify the parameter space. The constraints can partition the parameter space into feasible and infeasible regions. A design point within the parameter space may be feasible only if it satisfies all of the constraints; correspondingly, a design point within the parameter space may be infeasible if it violates one or more constraints. Note that minimizing f(x) can involve global optimization (e.g., finding a design point that can give the lowest feasible objective function over the entire parameter space) or local optimization (e.g., finding a design point that can give the lowest feasible objective function relative to a "nearby" region of the parameter space).

Embodiments of filter design tool 10 can use any method to solve the optimization problem and determine f(x). Generally, the method may iterate on x (or variables associated with the parameter space) in some manner. For example, an initial value for each parameter in x (or variables associated with the parameter space) may be chosen, the response quantities, specified by the objective function f(x) and the constraints may be computed, and a suitable algorithm may be applied to generate a new x (or variables associated with the parameter space) that can either reduce the objective function f(x), reduce the amount of infeasibility, or both. In various embodiments, optimization module 22 may use Nelder Mead algorithm to solve the optimization problem.

A compensation module 24 may compensate for non-idealities of operational amplifiers (op-amps) in the designed filter. A component selection module 26 may facilitate selecting components and simulating their behavior appropriately for the user's application. Components may include op amps, resistors, capacitors, and inductors (where applicable). Selecting components and simulating their behavior can include selecting specific components from a list of components; verifying whether calculated component values (e.g., resistances, capacitances, and op amp parameters) are valid; and otherwise enabling optimization module 22 to perform its intended operations. A tolerances module 28 may calculate behavior variances due to component tolerances. In various embodiments, optimization module 22, compensation module 24, component selection module 26, and tolerances module 28 may perform computations concurrently, in series, or in parallel, providing inputs to each other, processing the inputs appropriately, providing outputs to each other and otherwise co-operating to facilitate the filter design and optimization process.

Viewing parameters 29 may be specified by the user through input area 14 of user interface 12. Viewing parameters 29 may facilitate rendering appropriate design outputs related to the designed filter on viewing area 16. As used herein, the term "design output" includes any behavior or configuration of the filter determined (e.g., calculated, analyzed, uncovered, verified, established, concluded, resolved, etc.) in response to entering, changing, selecting, or otherwise manipulating filter parameters 18 and/or viewing parameters 29 in filter design tool 10. Examples of design outputs include circuit diagrams showing schematics of the filter design, with op amps, resistors and capacitors connected together to form a functional analog filter, graphs such filter responses (e.g., magnitude response and phase response) and filter circuit performance (e.g., noise characteristics), and block diagrams that provide representations of filter stages and other stage information as appropriate. For example, the design output can indicate the designed analog filter and its behavior obtained from solving the optimization problem.

A circuit module 30 may render a circuit diagram 32 on viewing area 16, for example, when viewing parameter 29 is chosen to be "circuit." Circuit diagram 32 may include component configuration and values calculated in filter design module 20. Filter behavior calculated by filter design module 20 may be displayed by graph module 34, which may render graph 36 on viewing area 16 of user interface 12. The user may choose a specific filter behavior to view as graph 36 by specifying appropriate viewing parameters 29. A diagram module 38 may render a block diagram 40 based on the components and corresponding values calculated by filter design module 20. Block diagram 40 may be chosen by the user to be viewed using appropriate viewing parameters 29.

An error module 42 may generate an error 44 that may be displayed on window area 17, for example, if any filter parameters 18 are incorrectly applied. An alert module 46 may generate an alert 48 on window area 17, for example, to indicate a warning, or other item to which the user's attention can be directed. A help module 50 may assist the user through an appropriate text 52, which may be displayed in window area 17, or viewing area 16, for example, based on the textual content generated.

According to various embodiments, an op amp database 54 may include various op amps (e.g., commercially available off the shelf), and corresponding op amp circuit parameters. Component selection module 26 may select appropriate op amps from op amp database 54 during the filter design process. A processor 56 and a memory element 58 may facilitate filter design tool 10 to perform the various operations described herein. Filter design tool 10 may provide at least one filter design file 60, evaluation board parameters 62, and filter design sharing 64 as one or more outputs. Other outputs and forms thereof may be included without departing from the broad scope of the embodiments.

For purposes of illustrating the techniques of filter design tool 10, it is important to understand the operations of a given system such as the architecture shown in FIG. 1. The following foundational information may be viewed as a basis from which the present disclosure may be properly explained. Such information is offered earnestly for purposes of explanation only and, accordingly, should not be construed in any way to limit the broad scope of the present disclosure and its potential applications.

In a general sense, filter design is the process of designing a filter that satisfies a set of requirements. Certain portions of the design process can be automated, but typically, based on certain filter design tools, an experienced electrical engineer with expertise in filters is needed to generate a good filter design. Typical requirements considered in the filter design process include the frequency response, phase shift or group delay, and impulse response of the filter; stability; low complexity; and manufacturability. Various software filter design tools are available to assist the filter designer in the filter design process.

A typical analog filter design tool incorporates two steps. In step 1, the behavior of the filter is determined in terms of attenuation and/or phase response. In step 2, the topology of the filter, including the specific circuit components and their interconnections, is defined. In general, any transfer function may be used to satisfy the attenuation and/or phase requirements of a particular filter at step 1. For example, a Butterworth filter, which has no ripple in the pass band or the stop band, may be selected as a suitable candidate for the filter design. The Butterworth filter achieves its flatness at the expense of a relatively wide transition region from passband to stopband, with average transient characteristics. In another example, a Chebyshev filter has a smaller transition region than the same-order Butterworth filter, at the expense of ripples in its passband. The Chebyshev filter improves on the amplitude response of the Butterworth filters at the expense of transient behavior. In yet another example, a Bessel filter can obtain better transient response than the Butterworth filter and the Chebyshev filter due to a linear phase (constant delay) in the passband, however, leading to relatively poor frequency response (e.g., less amplitude discrimination).

Turning to step 2 of the filter design process, filter topology typically determines the behavior of the filter, in terms of its natural frequency ($f_n$), quality factor (Q) and gain. An example filter topology is the Sallen-Key topology, where the filter is highly insensitive to the performance of the constituent op amp. Another example topology, namely the multiple feedback filter, uses the op amp as an integrator, and is used in low Q (<20) applications. Yet another example filter topology includes the state variable filter, which offers a more precise implementation, at the expense of many more circuit components. Gain, Q, and $f_n$ may be adjusted independently in the state variable filter. Variations in filter behavior due to temperature and component tolerances can be minimized in the state variable filter. Another example filter topology includes a biquadratic filter. Various other filter topologies may also be realized with filter design tools.

Turning to filter design tools that incorporate the above filter design steps, to design an analog filter, a user should enter in enough information to determine: (1) performance constraints (e.g., where to set the passband and stopband frequencies, the attenuation at the stopband and passband frequencies, etc.), and (2) filter response type (e.g., Butterworth, Chebyshev, Bessel, etc.). Some filter design tools force the user to enter the performance constraints without showing how those constraints affect the filter responses. Only when the user gets to the filter response step do the tools typically show the expected performance. Such filter design tools may not display the filter response contiguously (e.g., side-by-side, or together) on the same window or page.

As used herein, the term "window" may include a portion of a display on a computer monitor or other screen that can present contents seemingly independent of the rest of the screen. Windows can include frames, vertical and horizontal scrollbars, drag strips (e.g., usually along the top for dragging the entire window and along the other edges and lower corners for changing window size), buttons (e.g., for closing, maximizing and minimizing) and tabs (e.g., for moving among pages in a window). A graphical user interface (GUI) may be configured to open multiple windows, and selecting a window may move the selected window to the front (e.g., to become the active window) so as to display its visible contents, pushing other windows to the back (e.g., to become inactive windows).

Typically, each application on a computer (or other computing device) may open in its own window, and provide navigable pages within each window. As used herein, the term "page" includes any window within another window that cannot be moved out of the parent window. Many filter design tools provide tab-based navigation to move from page to page within the window. In other configurations, filter design tools may open within a web browser, and navigate from page to page through hyperlinks. Many other configuration options are available. However, the typical analog filter design tool available in the market does not provide the option of viewing the filter response, circuit diagram, circuit performance, circuit characteristics, etc. on the same page as the filter parameters input page; the user would have to navigate from input page to response page, clicking (or otherwise selecting) between the pages, in an effort to see the impact of changing component values, circuit topology and other component selections on the filter behavior.

Moreover, in a general sense, most filter design tools often allow the user to tweak the filter design by changing component values, but expect the user to be a filter expert. For example, such a filter design tool may allow the user to change the ratio of capacitors in the design; or it may present the user with a bill of materials for a filter circuit. Typically, the components in the circuit are not chosen based on the user's specific application needs. (Application needs are generally specified in terms of low noise, low power consumption, large voltage range, etc. as opposed to specific component values.) In other words, such tools may not convert typical application performance requirements (e.g., noise, power, voltage range) into specific circuit specifications, such as component recommendations and circuit topologies.

For example, Microchip FilterLab® 2.0 allows the user to modify the circuit topology and component values. The user can select resistors, capacitors, and the topology. However, the user cannot simultaneously see the effect of the choices on the filter performance, because the selections page is separate from the results viewing page on the tool's graphical user interface (GUI) window. In another example, Analog Devices Active Filter Design Tool allows the user to select a specific topology from a drop-down menu and specify component tolerances. A filter response may be viewed in another page of the window, where the component tolerance or filter topology selections are not available. To change the filter response, the user would have to go back to the selections page and manipulate the values, then navigate to the response page, and view the changed filter response.

In yet another example, Texas Instruments FilterPro filter design tool offers a page that permits the user to change component values directly in a circuit schematic and view the filter response (e.g., gain and phase response) on the same page. However, the tool assumes user expertise, and does not provide any options to determine the effect of the component values on the filter's noise, or power, or voltage ranges, or vice versa. Moreover, if the user were to seek optimization for noise, power, etc., the user may have to manually change the component values one by one and check the filter response each time. Alternatively, the user may have to run optimization algorithms in other applications (e.g., Matlab®), plug in the calculated values in the filter design tool, and view the response.

FilterPro offers a schematic, informational response curve in the filter selection page, but does not provide a real-time interactive response that changes with actual filter parameters entered in the selection page. Nor does FilterPro show how changing the component values might affect the actual filter response shape because of interactions of the components with a real op amp. Filter Pro assumes an ideal op amp, so its filter response curves are idealistic (or assumes a perfect best-case scenario). Filter responses for multiple filter types can be viewed on a filter response page, and selecting a specific type of filter (e.g., Chebyshev 1 dB filter) from a selection box in the same page may highlight the specific response curve for the selected filter. In providing the feature, the tool assumes user expertise in filters, for example, that the user knows the difference in performance between the Chebyshev filter, and the Bessel filter (or any one of the other options provided in the menu).

Some circuit design tools, such as WEBENCH® Power Designer for designing power systems provide a user interface where circuit responses, schematics and other information may be viewed on a single page. For example, WEBENCH Power Designer includes a 'charts' panel that shows graphs of key operating values (e.g., efficiency, duty cycle, currents, power dissipation, and phase margin) as they vary over input voltage and load current. WEBENCH Power Designer provides an 'optimize' panel, which allows the power system design to be optimized for small footprint, high efficiency and low cost by turning a knob; the page shows graphs of key parameters for different optimization settings so that the footprint, efficiency and cost for different knob settings may be viewed simultaneously. However, the WEBENCH Power Designer cannot be used to design filters, including analog filters. Moreover, the optimization aspect of the WEBENCH Power Designer cannot be ported over directly to analog filter design tools because the optimization parameters and methodology for analog filters are quite different from, and not as simplistic as (or even as well known as), those for power systems.

Filter design tool 10 is configured to address these issues (and others) in offering a more interactive and intelligent filter design experience. Embodiments of filter design tool 10 can allow the user to specify higher-level application parameters, which may be translated by embodiments of filter design tool 10 to lower level tweaking of the filter, thereby freeing the user from needing filter expertise to operate filter design tool 10. Various embodiments of filter design tool 10 can allow for at least three optimization parameters: (1) noise, (2) power, and (3) voltage range. Any suitable optimization parameters may be used within the broad scope of the embodiments.

According to various embodiments, filter design tool 10 may receive filter parameters 18 of the analog filter and viewing parameters 29 through user interface 12, optimize the analog filter according to the optimization parameter included in filter parameters 18, and display the design output according to the selected viewing parameter 29 on user interface 12. According to various embodiments, filter design tool 10 may determine a starting (e.g., initial) resistor value, calculate a gain bandwidth (GBW) range (e.g., width of the frequency range in which significant gain is available) allowed for the op amps to be used in the filter, select appropriate op amps from op amp database 54, resistors and capacitors, and determine the stage order to generate a filter design.

In an example embodiment, filter design tool 10 may allow the user to determine the filter response in terms of attenuation and/or phase response by selecting a filter type (e.g., low pass, bandpass, etc.) and selecting a filter response type (e.g., Butterworth, Chebyshev, etc.) and corresponding plurality of performance constraints (e.g., gain, passband frequency, etc.) In various embodiments, a slider may facilitate choosing the filter response type in input area 14, while substantially immediately viewing a filter response in contiguous viewing area 16.

According to various embodiments, filter design tool 10 may facilitate choosing components for the analog filter by manually selecting components, or choosing an optimization parameter from a list of available optimization parameters in input area 14. Based on selected viewing parameters 29, the design output may be displayed substantially simultaneously in contiguous viewing area 16. Some embodiments of filter design tool 10 may permit the user to adjust component values (e.g., the resistor and capacitor values) to compensate for op amp non-idealities. In some embodiments, circuit simulations may be performed substantially concurrently with the selections (e.g., natively in the tool's code) to calculate and display the design output on viewing area 16.

A suitable Components Object 66 may store variable names and values associated with the components in the filter. For example, resistor component values may be specified by variable names R1, R2, R3, R4, R5, and R6, where each resistor variable definition depends on the specific filter schematic. Capacitors may be specified by variable names C1, C2, and C3, where each capacitor variable definition depends on the specific filter schematic. The op amp may be specified by the following variables: Name (e.g., name of the op amp); GBW (gain bandwidth product of the op amp); Slew rate (e.g., slew rate); $R_{out}$ (e.g., output resistance of the op amp); $I_q$ (e.g., Quiescent supply current); Inoise (e.g., current noise spectral density); Vnoise (e.g., voltage noise spectral density); Out_HR+ (e.g., output voltage headroom required from positive supply); Out_HR− (e.g., output voltage headroom required from negative supply); In_HR+ (e.g., output voltage headroom required from positive supply); and In_HR− (e.g., input voltage headroom required from negative supply). Other variables stored in Components Object 66 include Type (e.g., lowpass, highpass, bandpass, bandstop, gain); and Implementation (e.g., Sallen-Key, Delyiannis Friend, First Order, Multiple Feedback, Gain, etc.).

Each implementation may indicate variables as follows: First order (low pass or high pass) may indicate a filter circuit topology with one op amp, R1, C1, R3, R4; Sallen-Key (low pass or high pass) may indicate a filter circuit topology one op amp, R1, R2, C1, C2, R3, R4; Multiple Feedback Low Pass may indicate a filter topology with no op amps, R1, R2, R3, C1, C2; Multiple Feedback High Pass may indicate a filter topology with no op amps, R1, R2, C1, C2, C3; Delyiannis Friend Bandpass may indicate a filter topology with one op amp, R1, R2, C1, C2, R3, R4, R5; Delyiannis Friend Bandstop may indicate a topology with one op amp, R1, R2, C1, C2, R3, R4, R5, R6; and so on.

Other variables may be stored in Components Object 66 depending on the type and implementation of filter used. An example embodiment of filter design tool 10 may accommodate up to 10 resistors, 10 capacitors, 4 op amps, and 4 inductors. Components Object 66 may be configured to accept any number of component variable names and values. Other variable names, types, and details may also be included in Components Object 66 within the broad scope of the embodiments.

In various embodiments, the user can make a change to filter parameters 18 and contemporaneously see the impact of the change on the same page, rather than having to navigate to another page or window. According to various embodiments, input area 14 may present the user with one or more options to change filter parameters 18. As used herein, "filter parameters" include a type of filter (e.g., low pass, high pass, etc.), gain, center frequency (e.g., for bandpass and bandstop filters), passband frequency, passband attenuation, passband ripple, stopband frequency, stopband attenuation, filter response type (e.g., Butterworth, Chebyshev, Bessel, etc.), optimization parameters (e.g., low noise, voltage range, low power), component tolerances, choice to compute filter response considering compensation for GBW, op amp voltage supplies, component sizing, component product names, filter architecture (e.g., topology), and any other parameters that may affect the filter design and associated filter behavior.

In various embodiments, filter parameters 18 that may not relate to the filter response associated with the user's selections may be invisible, disabled (e.g., greyed out), and otherwise rendered inaccessible to the user. For example, passband ripple may be disabled for Butterworth and Bessel filter response types. In another example, stopband ripple may be disabled for most responses, and enabled for Inverse Chebyshev and Elliptic filter response types.

In an example embodiment, filter response type choices (e.g., Chebyshev, Butterworth, Bessel, etc.) may be presented in a continuum between two specifications that are of interest to the user. For example, the user may specify the filter response type with a slider where the user can easily see tradeoffs, rather than picking from a list of filter response types, such as Chebyshev, or Bessel. A slider control may be provided from "fewest stages" to "fastest settling." The example embodiment may use the Chebyshev topology when the slider is set on "fewest stage," and the Bessel topology when the slider is set to "fastest settling." An intermediate point along the slider may indicate the Butterworth topology.

Any suitable filter response type label may be used in the slider control within the broad scope of the embodiments. Examples of filter response type labels include "linear phase," "fewest components," "fewest op amps," "lowest Q," "robust component tolerance," "lowest ripple," "least ringing," "constant group delay," "steepest roll-off," etc. In other embodiments, more than two dimensions may be presented to the user. For example, a "trade-off triangle" with three different parameters of interest may be presented in lieu of the onedimensional slider. Moreover, any number of filter response types may be used within the broad scope of the embodiments, in addition to or alternative to, Bessel, Butterworth and Chebyshev filters. For example, the Equiripple, Gaussian, Legendre, Elliptic, Inverse Chebyshev, Halpern filters, or any other type of filter may be used.

Filter design module 20 may receive filter parameters 18 and design a filter accordingly. Filter parameters 18 and viewing parameters 29 may be used in rendering appropriate the design output on viewing area 16 associated with the designed filter. As used herein, "viewing parameters" may include phase (e.g., in degrees and radians), step response, stage characteristics (e.g., number of stages, frequency cut-offs, and quality factors), circuit schematics, noise, magnitude (e.g., as ratio of voltages, or in decibels (dB)), power, voltage range, group delay, phase delay, poles and zeroes, impulse response, and any other filter parameter that may be visually rendered in a suitable format. For example, the user's specified frequency limits may be superimposed on graph 36 to aid the user in understanding how the limits affect the filter performance. Example parameters (including filter parameters 18 and viewing parameters 29) imposed on the graph include gain, passband frequency, passband attenuation, passband ripple, stopband frequency, stopband ripple, stopband ripple, magnitude limits at other frequencies, minimum or maximum limits on phase, minimum or maximum limits on phase delay, minimum or maximum limits on group delay, minimum or maximum limits on step response time, etc.

In some embodiments, user interface 12 may present a plurality of pages. The pages may be configured to be navigable according to a filter design process, for example, selecting a filter type; selecting performance constraints and a filter response type; specifying optimization parameters; and specifying component tolerances. When a page comprising a step in the filter design process is displayed as an active page in user interface 12, any one of the pages comprising previous steps in the filter design process can be selected to be rendered the active page. However, pages comprising subsequent steps in the filter design process cannot be selected to be rendered the active page before completing the step in the currently active page. Thus, the user may be encouraged to follow the proper (e.g., suitable, desired, recommended) filter design process while navigating the plurality of pages.

According to various embodiments, performance constraints and design output may be displayed concurrently on one page rather than in two different pages. The user may be able to see the design output contemporaneously with inserting filter parameters 18 and/or viewing parameters 29. For example, selecting the filter type, entering filter parameters 18 and viewing parameters 29 and viewing the design output and/or other renderings (e.g., errors, alerts) may be facilitated on a single page (e.g., in one step).

In other embodiments, filter parameters 18 may be entered in more than one page, and the design output may be displayed along with some of filter parameters 18 on one of the pages. In an example embodiment, a first page may present input area 14 exclusively to enter the filter type (e.g., low-pass, high-pass, etc.) without presenting any design output (e.g., design output may not be rendered unless and until a filter type is chosen); a second and subsequent pages may present input area 14 and viewing area 16 contiguously (e.g., side by side, one beneath the other, etc.).

According to various embodiments, changing viewing parameters 29 and/or filter parameters 18 may cause the filter performance to be recalculated and suitably rendered on viewing area 16. In various embodiments, filter performance constraints may be set on the same page (or window, screen, etc.) as the design output can be immediately calculated and displayed to the user upon any user entered change (e.g., entering new and/or updated filter parameters 18 and/or viewing parameters 29) to facilitate real-time feed back.

Embodiments of filter design tool 10 may be applied to any filter type, including low pass, high pass, band-pass, band-stop filters and all pass filters. Moreover, filter design tool 10 may be used to design analog filters and digital filters (e.g., infinite impulse response (IIR) filter), with appropriate configuration of user interface 12 and filter design module 20, among other features.

In various embodiments, at any step of the filter design process, the user may access help module 50. Help module 50 may present information that can facilitate understanding the filter design process, and other aspects of filter design tool 10 as desired. Help module 50 may present user search query fields, textual content in response to the user clicking on certain portions of user interface 12, searchable Table of Contents, or Index, informational tips for a more efficient design process, etc. Any suitable information that can facilitate the filter design process or operation of filter design tool 10 may be included in help module 50 in any suitable format, or form.

Turning to the infrastructure of filter design tool 10, filter design tool 10 may be implemented on any suitable computing device (e.g., server, desktop computer, laptop computer, smart phone, etc.) equipped with appropriate hardware (e.g., display screen, monitor, etc.) to facilitate the operations thereof. In some embodiments, filter design tool 10 may interface with the hardware (e.g., display monitors) to perform the operations described herein. For example, user interface 12 may be rendered on a display screen visible to the user, and may be associated with other hardware (e.g., mouse, joystick, touchscreen, keyboard) through which the user can manipulate filter parameters 18 and viewing parameters 29 in user interface 12.

In various embodiments, filter design tool 10 may be located on a single device. In other embodiments, filter design tool 10 may be distributed across multiple devices on a network, which can include any number of interconnected servers, virtual machines, switches, routers, and other nodes. Elements of FIG. 1 may be coupled to one another through one or more interfaces employing any suitable connection (wired or wireless), which provides a viable pathway for electronic communications. Additionally, any one or more of these elements may be combined or removed from the architecture based on particular configuration needs.

In some embodiments, filter design tool 10 may include applications and hardware that operate together to perform the operations described herein. For example, a portion of filter design tool 10 may be implemented in hardware, and another portion may be implemented in software, for example, as an application. As used herein, an "application" can be inclusive of an executable file comprising instructions that can be understood and processed on a computer, and may further include library modules loaded during execution, object files, system files, hardware logic, software logic, or any other executable modules.

Note that the numerical and letter designations assigned to the elements of FIG. 1 do not connote any type of hierarchy; the designations are arbitrary and have been used for purposes of teaching only. Such designations should not be construed in any way to limit their capabilities, functionalities, or applications in the potential environments that may benefit from the features of filter design tool 10. It should be understood that the architecture shown in FIG. 1 is simplified for ease of illustration.

Figure 2:
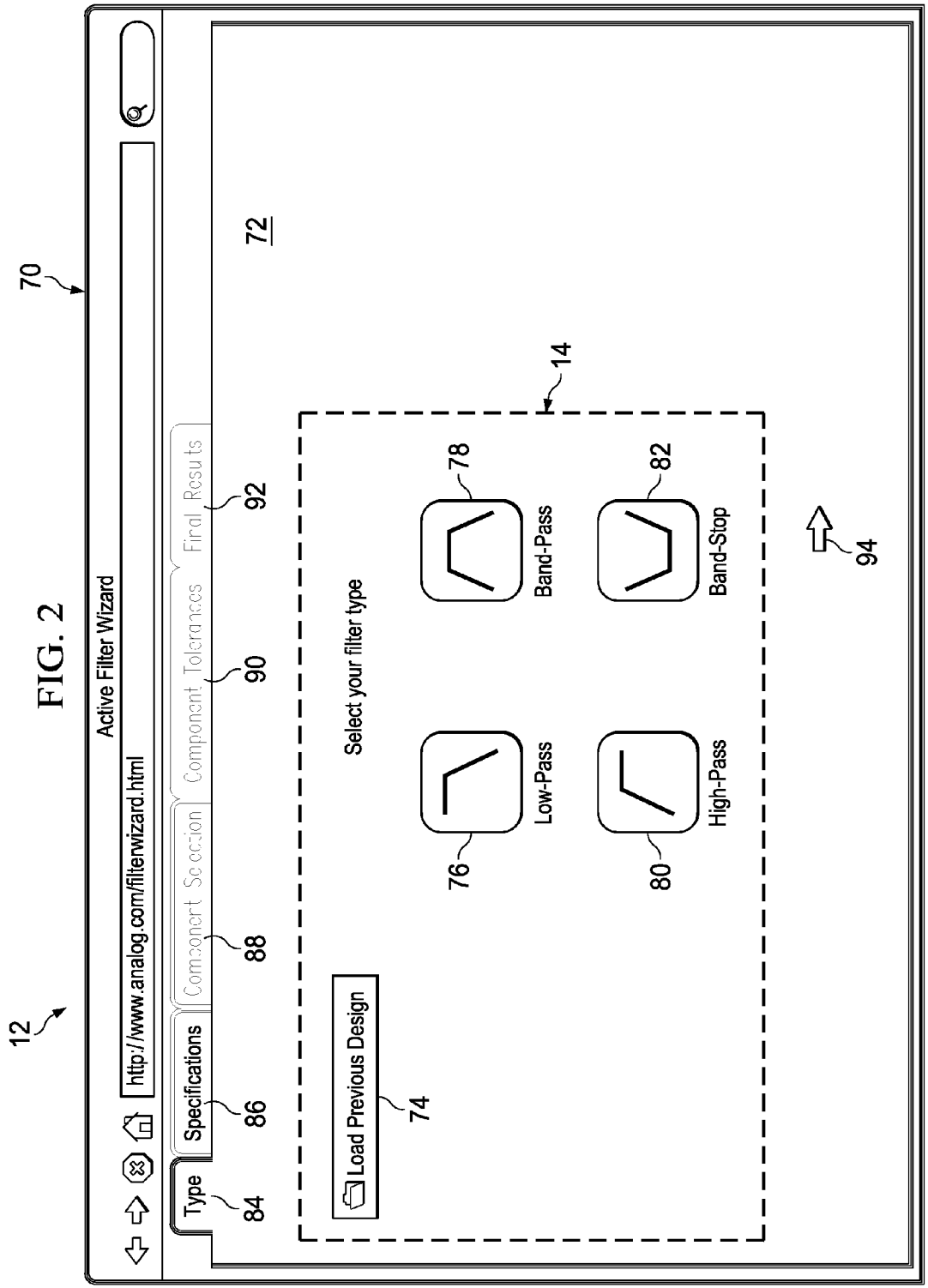
FIG. 2 is a simplified diagram illustrating an example screen shot associated with an embodiment of the filter design tool.

Turning to FIG. 2, FIG. 2 is a simplified diagram showing an example screen shot of an example user interface 12 in an embodiment of filter design tool 10. A window 70 includes a first page 72 providing input area 14 for selecting a filter type and/or loading a previously prepared filter design through an appropriately labeled button 74. Buttons 76, 78, 80 and 82 may permit the user to select a low pass filter, band pass filter, high pass filter, and band stop filter, respectively. Clicking on respective buttons 76, 78, 80 or 82 may bring up relevant input fields to enter other suitable filter parameters 18 associated with the selected filter type. In other embodiments, clicking on respective buttons 76, 78, 80 and 82 may take the user to the subsequent page relevant to the clicked-on button, and which may provide input fields to enter corresponding filter parameters 18 and viewing parameters 29.

Window 70 may include multiple pages that may be selected by clicking on tabs 84, 86, 88, 90 and 92. For example, selecting tab 84 may bring up page 72 into active view, wherein input area 14 and viewing area 16 (if applicable) may be displayed contiguously on user interface 12. Pages that cannot be selected (e.g., disabled) may be indicated by greyed out tabs. In the example screen shot of the FIGURE, tabs 86, 88, 90 and 92 ("Specifications," "Component Selection," "Component Tolerances," and "Final Results" respectively) may be greyed out, for example, because selecting filter frequencies, or selecting components, etc. may not be feasible without first selecting a filter type on page 72. A clickable artifact (e.g., arrow, text, icon, etc.) 94 may facilitate navigating to the next step in the filter design process.

According to various embodiments, the user can navigate to subsequent tabs from the current page by either pressing artifact 94 (e.g., next or back buttons at the bottom of the page) or by pressing a suitable tab (e.g., selecting one of tabs 84, 86, 88, 90, 92). The user may not be allowed to use the tab to jump to a page out of order, unless that page is not greyed out (e.g., the user can use the tab to go to next page, but not next page+1). The tabs may be greyed out unless the user has already visited that page. In an example embodiment, if the user goes to a previously visited page from the current page, and modifies values of filter parameters 18 in input area 14, all following pages may be greyed out to indicate that additional information may be needed (e.g., the user needs to redo the work).

In some embodiments, the user may be prevented from going to the next page if something is wrong in the current page. Such cases include, merely as examples and not as limitations: (1) no type selected on first page (e.g., "Type" page); (2) not able to compute a filter response on second page (e.g., "Specification" page); (3) not able to compute components on third page (e.g., "Component Selection" page); (4) the user has selected "ideal" for any of the controls on fourth page (e.g., "Component tolerances" page). In any of the cases where the user cannot proceed without re-entering or correcting appropriate filter parameters 18, error 44 may be displayed when the user attempts to use artifact 94 (or tabs) to proceed to a next page. In some embodiments, when the mouse cursor hovers over artifact 94, text 52 in the form of a tip strip may display the same information. In some embodiments, when the user is not prevented from going to a page, artifact 94 may display text indicating the target page that the user can land on if artifact 94 is selected when the mouse cursor hovers thereon.

Figure 3:
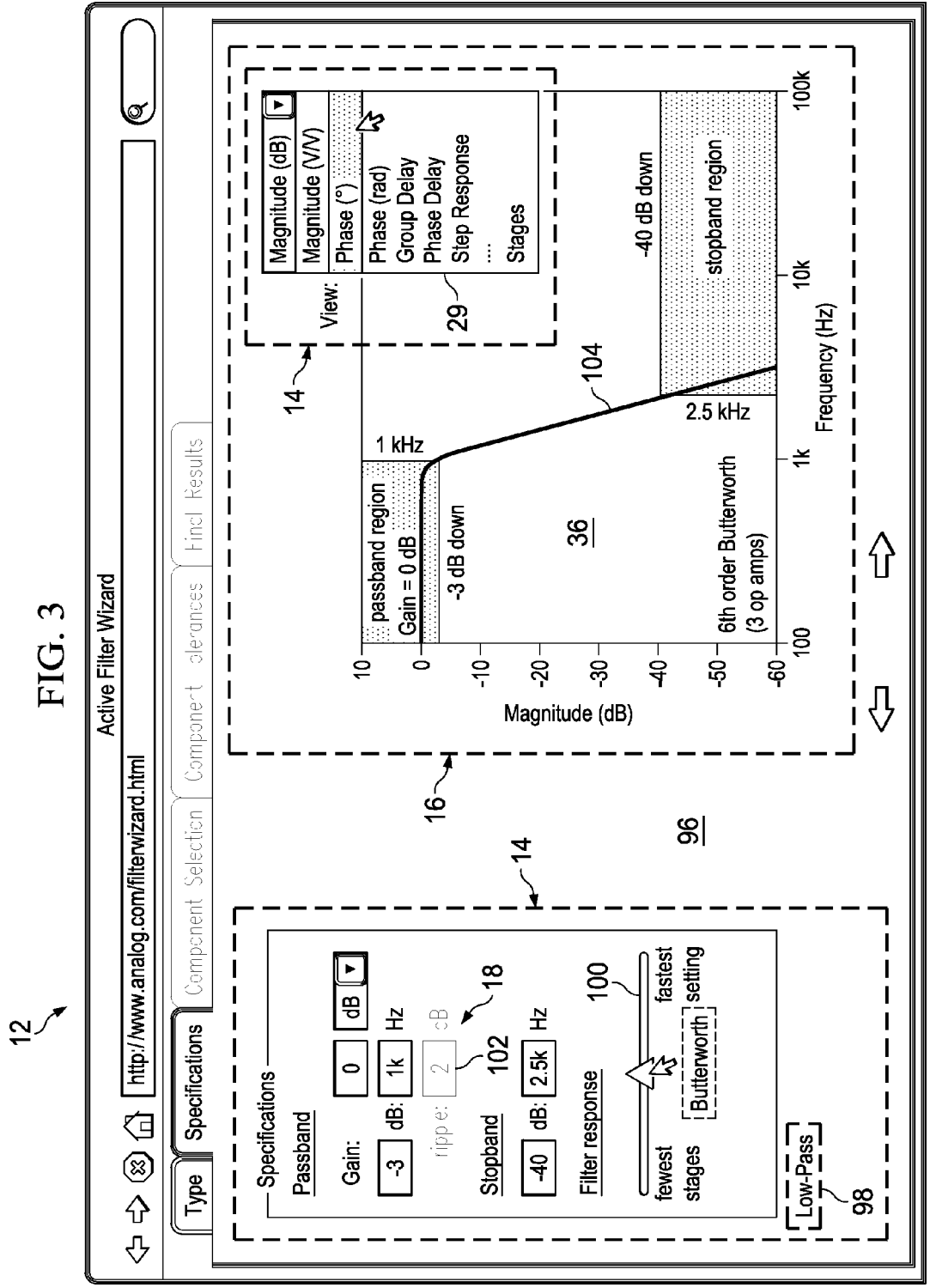
FIG. 3 is a simplified diagram illustrating another example screen shot associated with an embodiment of the filter design tool.

Turning to FIG. 3, FIG. 3 is a simplified diagram showing another example screen shot of example user interface 12 in an embodiment of filter design tool 10. Page 96 may present performance constraints to be entered in input area 14. For example, gain, frequency, etc. may be entered in appropriate fields on page 96. The entered parameters and corresponding values may be aggregated into filter parameters 18. A label 98 may inform the user about filter parameters 18 selected in previous pages (e.g., low pass filter type). A slider control 100 in input area 14 may facilitate selecting an appropriate filter response type. Slider control 100 may have a plurality of selectable options displayed as a continuum bar from a first end to a second end. Placing the slider on the bar may indicate a specific filter response type.

Slider choice can affect the filter architecture and other features, for example, whether the passband ripple control 102 is greyed out. For example, when the slider is located on a first end labeled "fewest stage," the filter response type may correspond to a Chebyshev filter, and passband ripple control 102 may not be greyed out; when the slider is located approximately in the middle, the filter response type may indicate a Butterworth filter and passband ripple control 102 may be greyed out; when the slider is located on the second end labeled "fastest setting," the filter response type may correspond to a Bessel filter and passband ripple control 102 may be greyed out.

Such filter response type selections can cause filter design tool 10 to calculate a number of stages (and circuit schematic, without specific component values) of the filter to be designed using various algorithms and methods known in the art. In the example embodiment shown in the FIGURE, entering suitable filter parameters 18 in the Type page and Specifications page can create the constraints for the optimization problem. Various other selections may be implemented within the broad scope of the embodiments.

Viewing area 16 may display a design output (e.g., frequency response 104) based upon filter parameters 18 entered in input area 14. Another input area 14 may facilitate entering viewing parameters 29. In the example screen, viewing parameters 29 may be selected from a drop-down menu featuring magnitude, phase, group delay, etc. Changing filter parameters 18 on page 96 may result in a correspondingly different design output in viewing area 16 on same page 96. The user can simultaneously view the design output and manipulate the input parameters on the same page. In the example screen shot of the FIGURE, filter frequency response 104 is displayed as graph 36 with appropriate legends, axes and other graphical features.

Figure 4A:
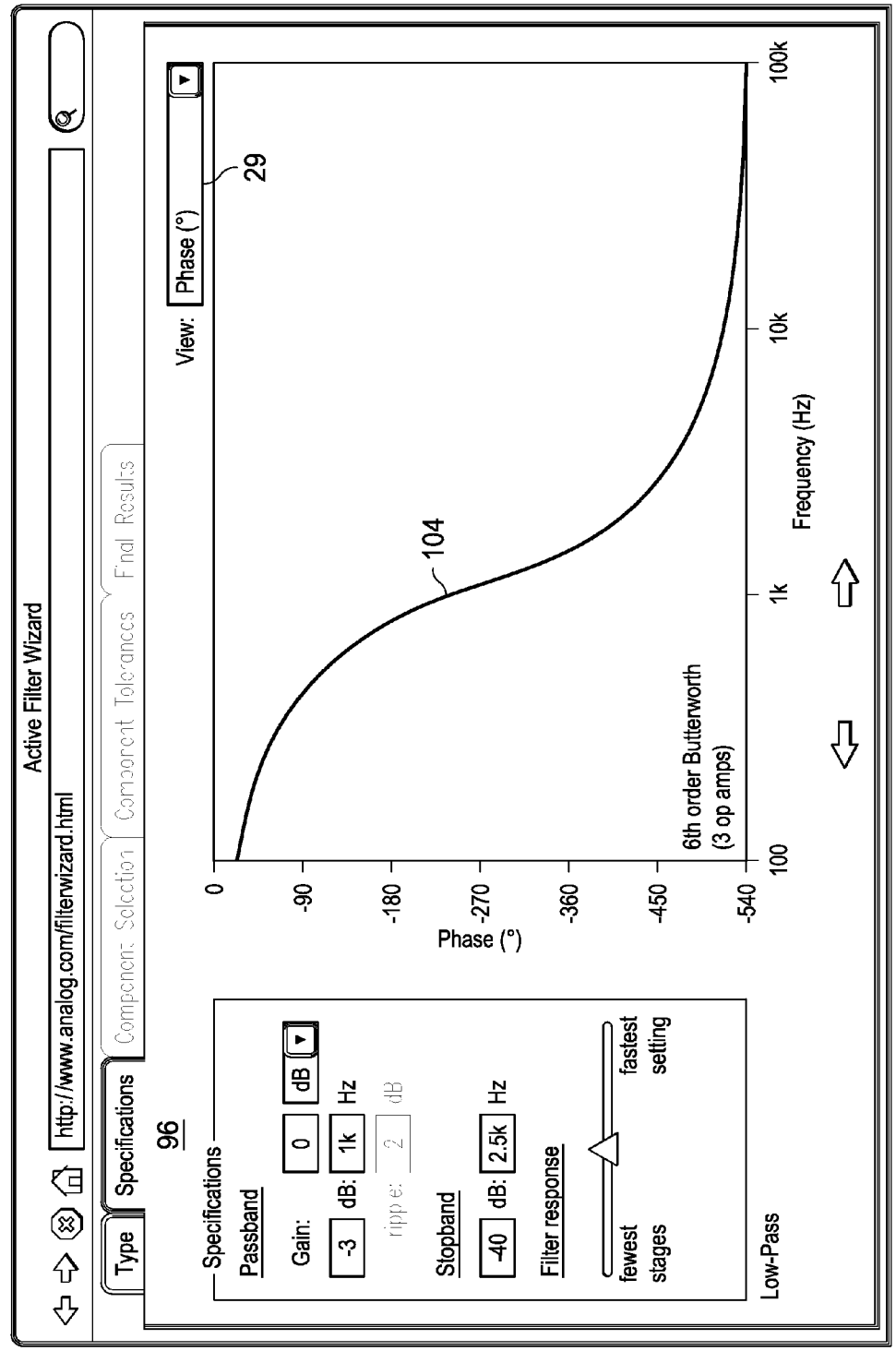
Figure 4B:
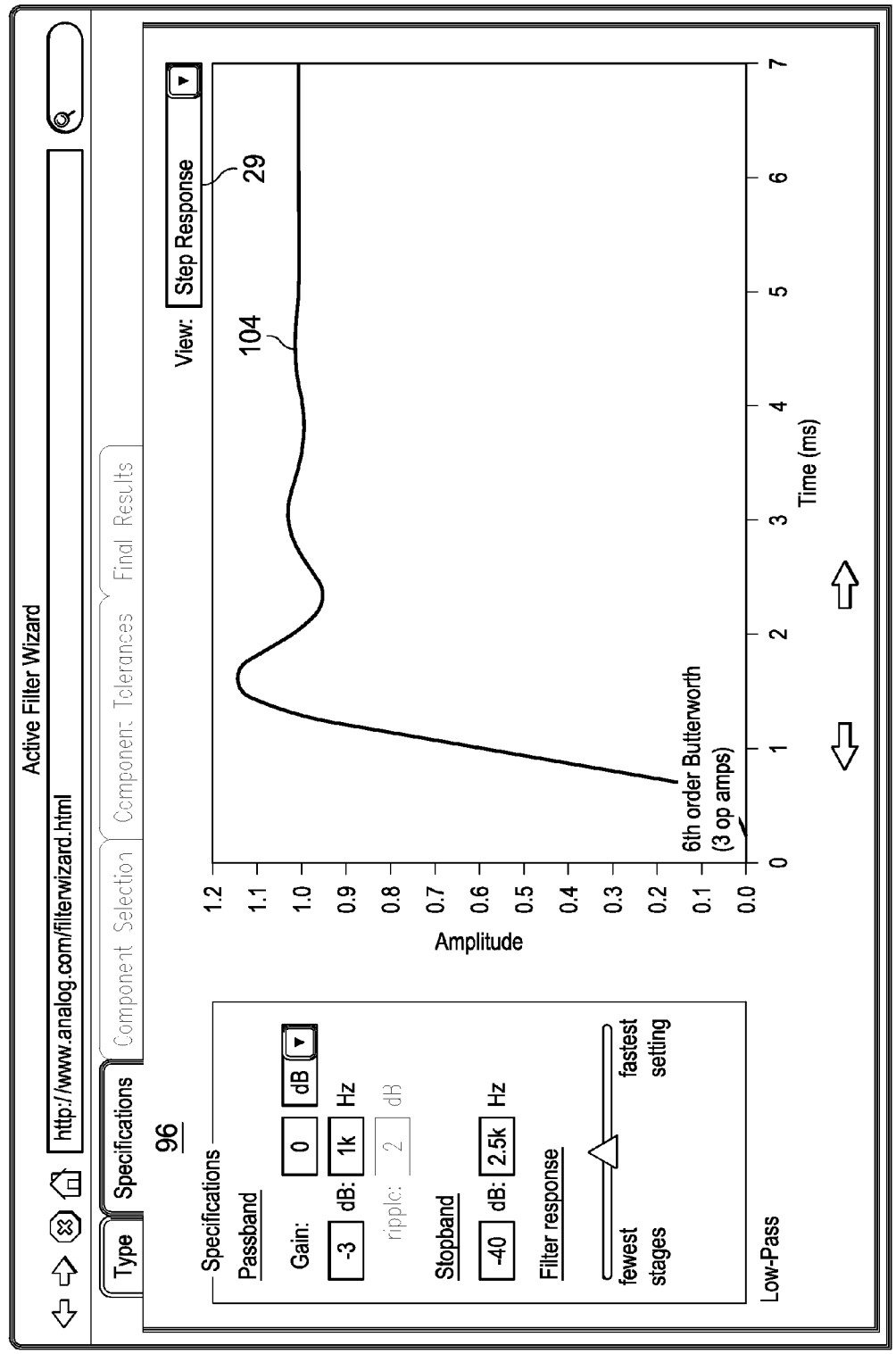
Figure 4C:
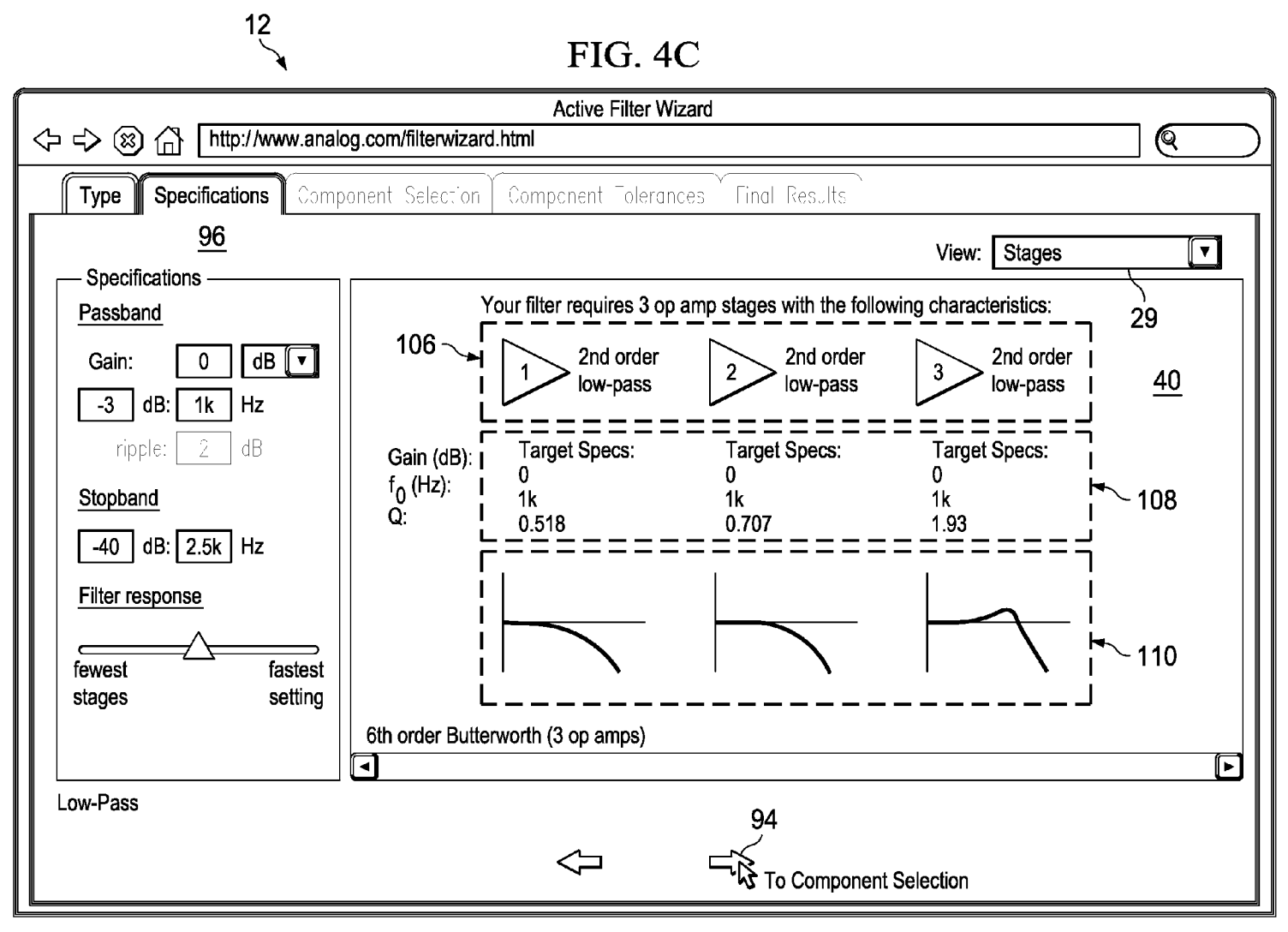

Turning to FIGS. 4A-4C, FIGS. 4A-4B are simplified diagrams showing example screen shots of example user interface 12 in an embodiment of filter design tool 10. In FIG. 4A, viewing parameter 29 is set to "Phase (°)." Filter frequency response 104 accordingly displays the phase in degrees corresponding to filter parameters 18 entered on page 96. In FIG. 4B, viewing parameter 29 is changed to "Step Response." Filter frequency response 104 accordingly changes to step response corresponding to filtered parameters 18 entered on page 96.

Turning to FIG. 4C, viewing parameter 29 may be set to "Stages." Viewing area 16 thereupon displays the design output as a block diagram 40 indicating the three stages of the filter design corresponding to filter parameters 18 entered on page 96. Information pertaining to the stages in the designed filter may be indicated as stage information 106. Stage information 106 may indicate, for example, that each stage comprises a 2nd order low pass filter. Target specifications ("target specs") 108 for each stage may be shown below stage information 106. A relatively simplified filter response diagram 110 may also be shown below stage information 106. Changing filter parameters 18 on page 96 can correspondingly change stage information 106 (including the number of stages), target specifications 108 and filter response diagram 110. Artifact 94 may be selected to proceed to the next step (e.g., component selection) of the filter design process.

Turning to FIG. 5, FIG. 5 is an example table 112 indicating certain example limit values of filter parameters 18 for a low pass filter according to an embodiment of filter design tool 10. If the user enters values that are beyond the limits indicated in table 112, embodiments of filter design tool 10 may display error 44. In an example embodiment, error 44 may be displayed in viewing area 16. In another example embodiment, error 44 may be displayed in window area 17 of user interface 12. Filter design module 20 may stop further design or display calculations when there is an error message condition.

Examples of error 44 include: (1) ripple value entered is larger than absolute value of passband attenuation; error 44 may be displayed as text (e.g., ("Passband ripple should be less than passband attenuation") and colors (e.g., numeric values for passband ripple and passband attenuation may turn red); (2) stopband frequency is less than or equal to passband frequency; error 44 may be displayed as text (e.g., "Passband frequency should be less than stopband frequency") and colors (e.g., numeric values for passband frequency and stopband frequency may turn red); (3) absolute value of stopband attenuation is less than or equal to absolute value of passband attenuation); error 44 may be displayed as text (e.g., "Stopband attenuation should be lower than passband attenuation") and colors (e.g., numeric values for passband attenuation and stopband attenuation may turn red). Various other error formats, conditions and display may be included within the broad scope of the embodiments.

Turning to FIG. 6, FIG. 6 illustrates an example table 114 indicating certain example limit values of filter parameters 18 for a high pass filter according to an embodiment of filter design tool 10. If the user enters values that are beyond the limits indicated in table 114, embodiments of filter design tool 10 may display error 44. In an example embodiment, error 44 may be displayed in viewing area 16. In another example embodiment, error 44 may be displayed in window area 17 of user interface 12. Filter design module 20 may stop further design or display calculations when there is an error message condition.

Examples of error 44 include: (1) ripple value entered is larger than absolute value of passband attenuation; error 44 may be displayed as text (e.g., ("Passband ripple should be less than passband attenuation") and colors (e.g., numeric values for passband ripple and passband attenuation may turn red); (2) stopband frequency is greater than or equal to passband frequency; error 44 may be displayed as text (e.g., "Passband frequency should be more than stopband frequency") and colors (e.g., numeric values for passband frequency and stopband frequency may turn red); (3) absolute value of stopband attenuation is less than or equal to absolute value of passband attenuation); error 44 may be displayed as text (e.g., "Stopband attenuation should be lower than passband attenuation") and colors (e.g., numeric values for passband attenuation and stopband attenuation may turn red). Various other error formats, conditions and display may be included within the broad scope of the embodiments.

Turning to FIG. 7, FIG. 7 illustrates an example table 116 indicating certain example limit values of filter parameters 18 for a band pass filter according to an embodiment of filter design tool 10. If the user enters values that are beyond the limits indicated in table 116, embodiments of filter design tool 10 may display error 44. In an example embodiment, error 44 may be displayed in viewing area 16. In another example embodiment, error 44 may be displayed in window area 17 of user interface 12. Filter design module 20 may stop further design or display calculations when there is an error message condition.

Examples of error 44 include: (1) ripple value entered is larger than absolute value of passband attenuation; error 44 may be displayed as text (e.g., ("Passband ripple should be less than passband attenuation") and colors (e.g., numeric values for passband ripple and passband attenuation may turn red); (2) stopband frequency is greater than or equal to passband frequency; error 44 may be displayed as text (e.g., "Passband frequency should be more than stopband frequency") and colors (e.g., numeric values for passband frequency and stopband frequency may turn red); (3) absolute value of stopband attenuation is less than or equal to absolute value of passband attenuation); error 44 may be displayed as text (e.g., "Stopband attenuation should be lower than passband attenuation") and colors (e.g., numeric values for passband attenuation and stopband attenuation may turn red). Various other error formats, conditions and display may be included within the broad scope of the embodiments.

Turning to FIG. 8, FIG. 8 illustrates an example table 118 indicating certain example limit values of filter parameters 18 for a bandstop filter according to an embodiment of filter design tool 10. If the user enters values that are beyond the limits indicated in table 118, embodiments of filter design tool 10 may display error 44. In an example embodiment, error 44 may be displayed in viewing area 16. In another example embodiment, error 44 may be displayed in window area 17 of user interface 12. Filter design module 20 may stop further design or display calculations when there is an error message condition.

Examples of error 44 include: (1) ripple value entered is larger than absolute value of passband attenuation; error 44 may be displayed as text (e.g., ("Passband ripple should be less than passband attenuation") and colors (e.g., numeric values for passband ripple and passband attenuation may turn red); (2) stopband frequency is greater than or equal to passband frequency; error 44 may be displayed as text (e.g., "Passband frequency should be more than stopband frequency") and colors (e.g., numeric values for passband frequency and stopband frequency may turn red); (3) absolute value of stopband attenuation is less than or equal to absolute value of passband attenuation); error 44 may be displayed as text (e.g., "Stopband attenuation should be lower than passband attenuation") and colors (e.g., numeric values for passband attenuation and stopband attenuation may turn red). Various other error formats, conditions and display may be included within the broad scope of the embodiments.

Turning to FIG. 9, FIG. 9 illustrates an example table 120 indicating certain example default values of filter parameters 18 according to an example embodiment of filter design tool 10. If the "Specification" page (e.g., page 96) is entered for a first time in a filter design process (e.g., the user is entering filter parameters 18 without using a pre-designed filter), the example default values indicated in table 120 may be used, and displayed accordingly in input area 14 of user interface 12. The user may modify filter parameters 18 suitably, based on the user's application needs.

If the user enters the "Specification" page from the previous page, and has loaded parameters from a previously designed filter, the appropriate values from the previously designed filter may be displayed in input area 14 of user interface 12. Embodiments of filter design tool 10 may store last used states (e.g., filter parameters 18, viewing parameters 29, etc.) for future reference according to an example embodiment. In some embodiments, the last used states may be saved for the session alone; in other embodiments, the last used states may be saved even after window 70 is closed (e.g., filter design tool 10 application is closed).

Figure 10:
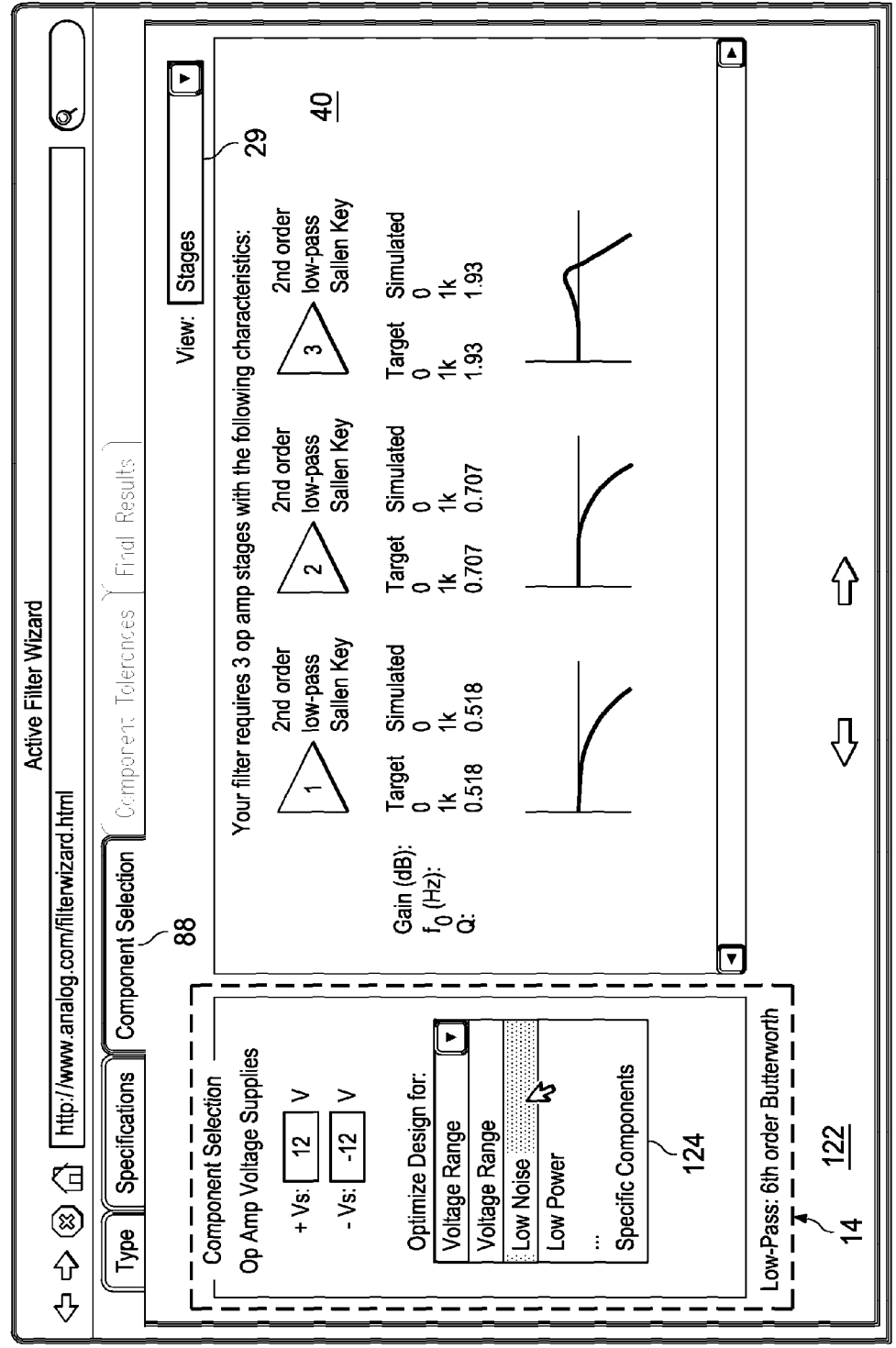
FIG. 10 is a simplified diagram illustrating yet another example screen shot associated with an embodiment of the filter design tool.

Turning to FIG. 10, FIG. 10 is a simplified diagram showing an example screen shot of example user interface 12 in an embodiment of filter design tool 10. Page 122 may be displayed when the user clicks tab 88 (e.g., "Component selection") or clicks on the appropriate artifact (e.g., artifact 94) from the previous page (e.g., "Specification" page 96). In the example screen shot, viewing parameter 29 has been set to stages, displaying block diagram 40 on viewing area 16. In input area 14, op amp voltage supplies and optimization parameters 124 may be entered by the user. For example, the user may select optimization according to voltage range, or low power, or low noise, etc. The user may also choose to by-pass the optimization feature and enter specific components.

Figure 11A:
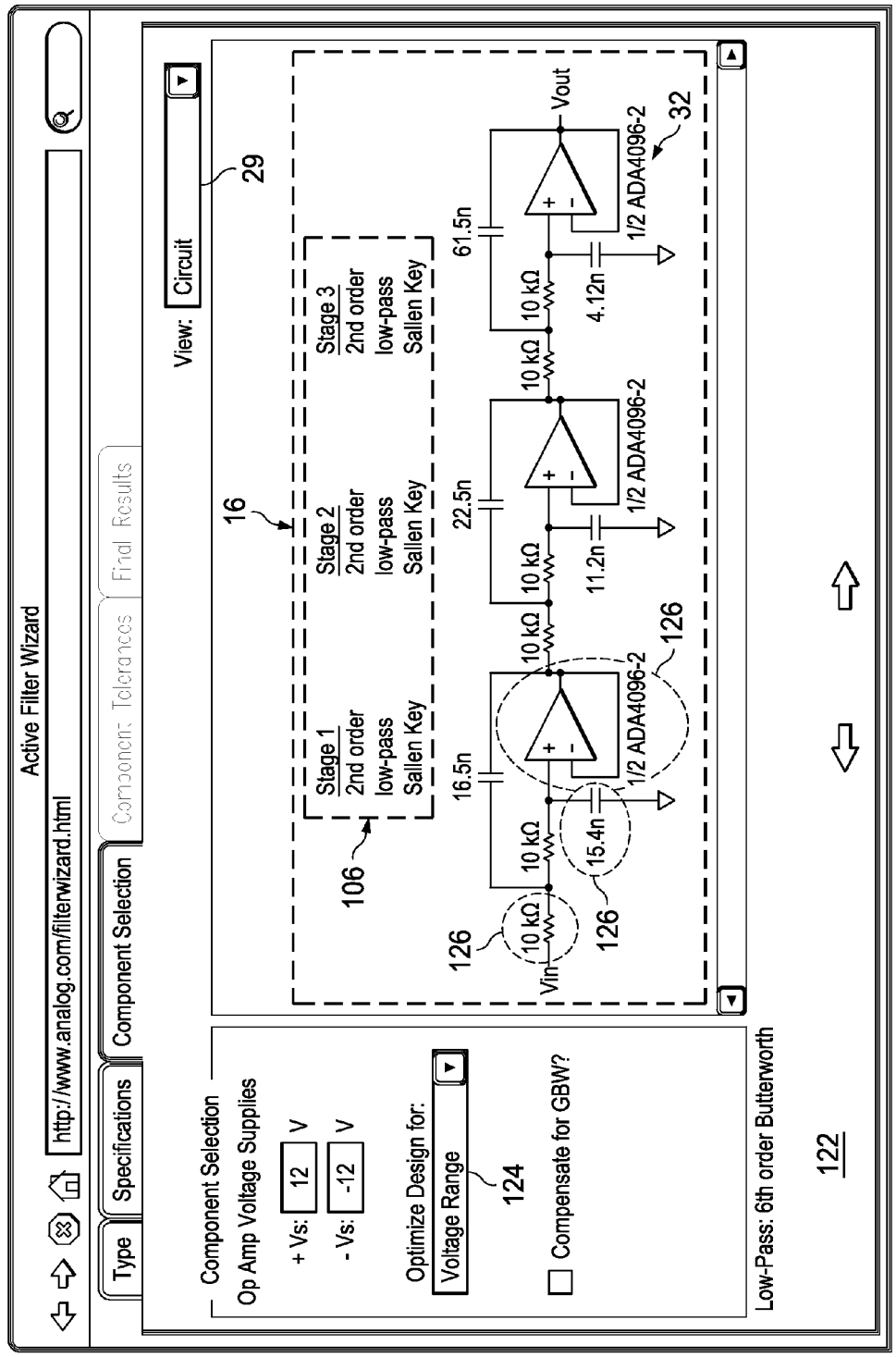
Figure 11B:
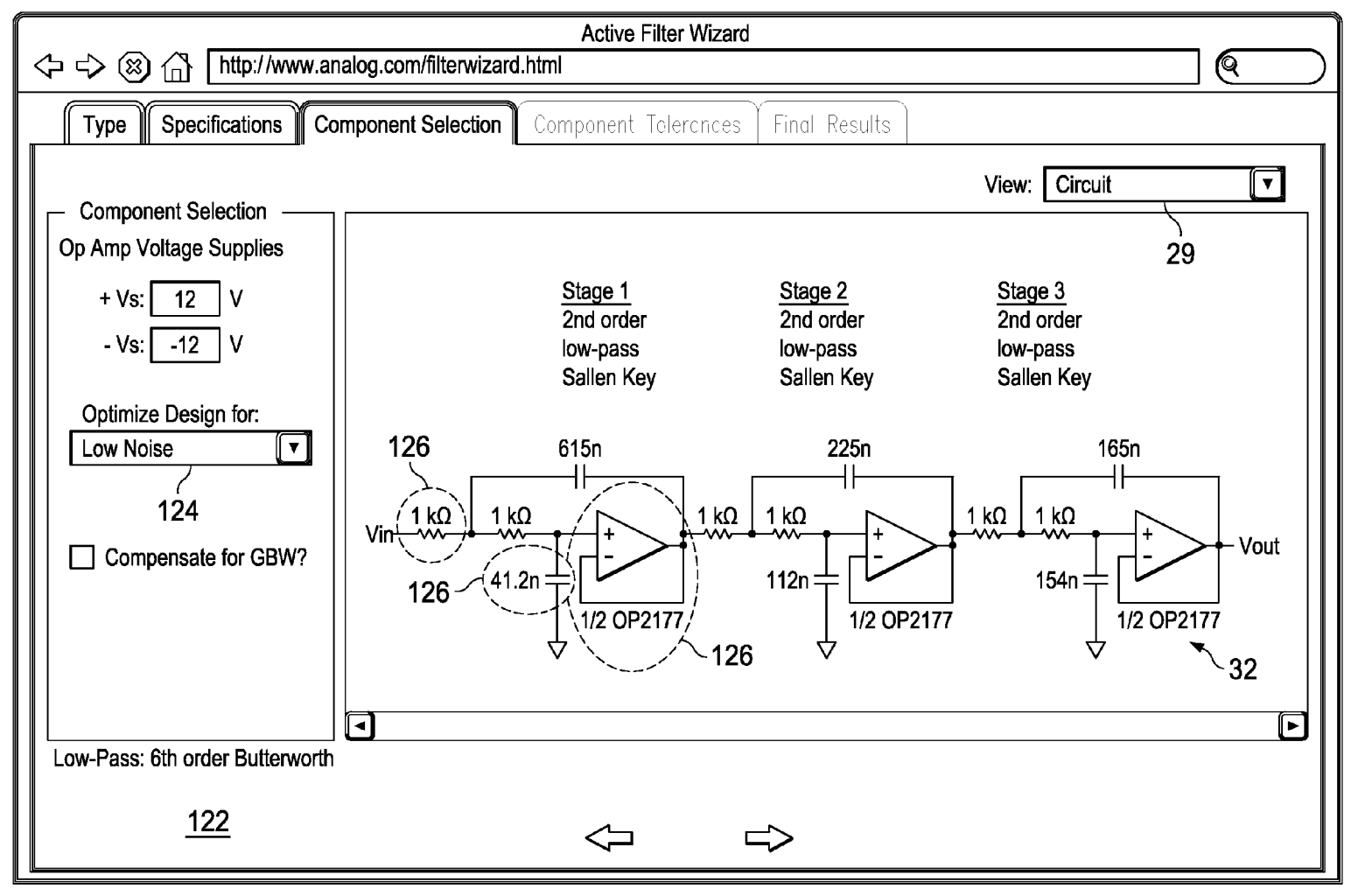

Turning to FIGS. 11A-11B, FIGS. 11A-11B are simplified diagrams showing example screen shots of example user interface 12 in an embodiment of filter design tool 10. Selecting "circuit" as viewing parameter 29 may display circuit diagram 32 in viewing area 16 of page 122. Stage information 106 may also be displayed concurrently with circuit diagram 32. Selecting "Voltage range" as optimization parameter 124 on page 122 may cause filter design tool 10 to calculate appropriate component values 126 of the filter. In the FIGURE, certain components are highlighted and labeled as component values 126 for ease of illustration; it may be noted that any and all component values used in the filter can be included in component values 126. If the user changes optimization parameter 124 to "Low noise" as indicated in FIG. 11B, filter design tool 10 may recalculate component values 126 and modify circuit diagram 32 appropriately.

Figure 12A:
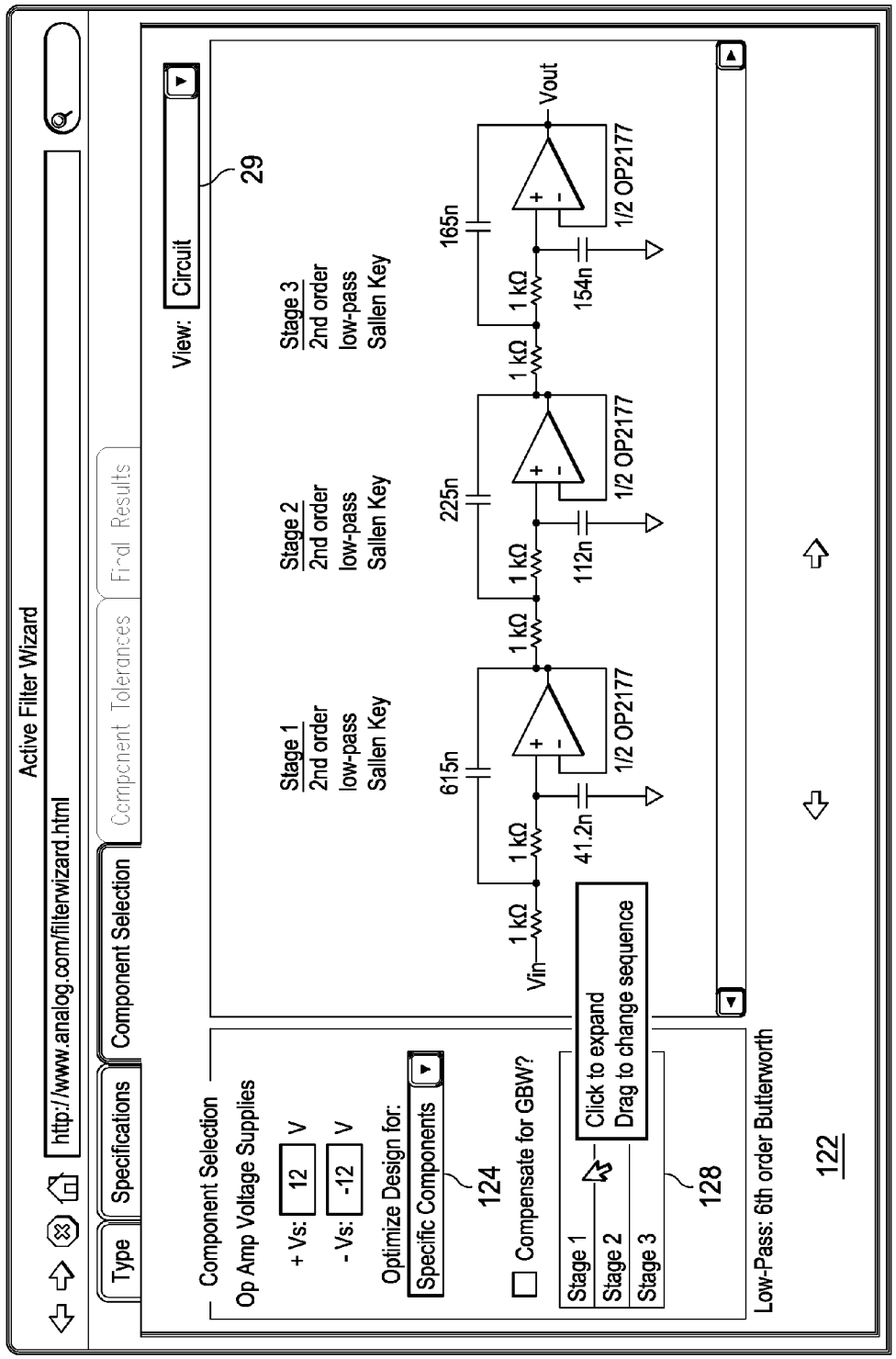
Figure 12B:
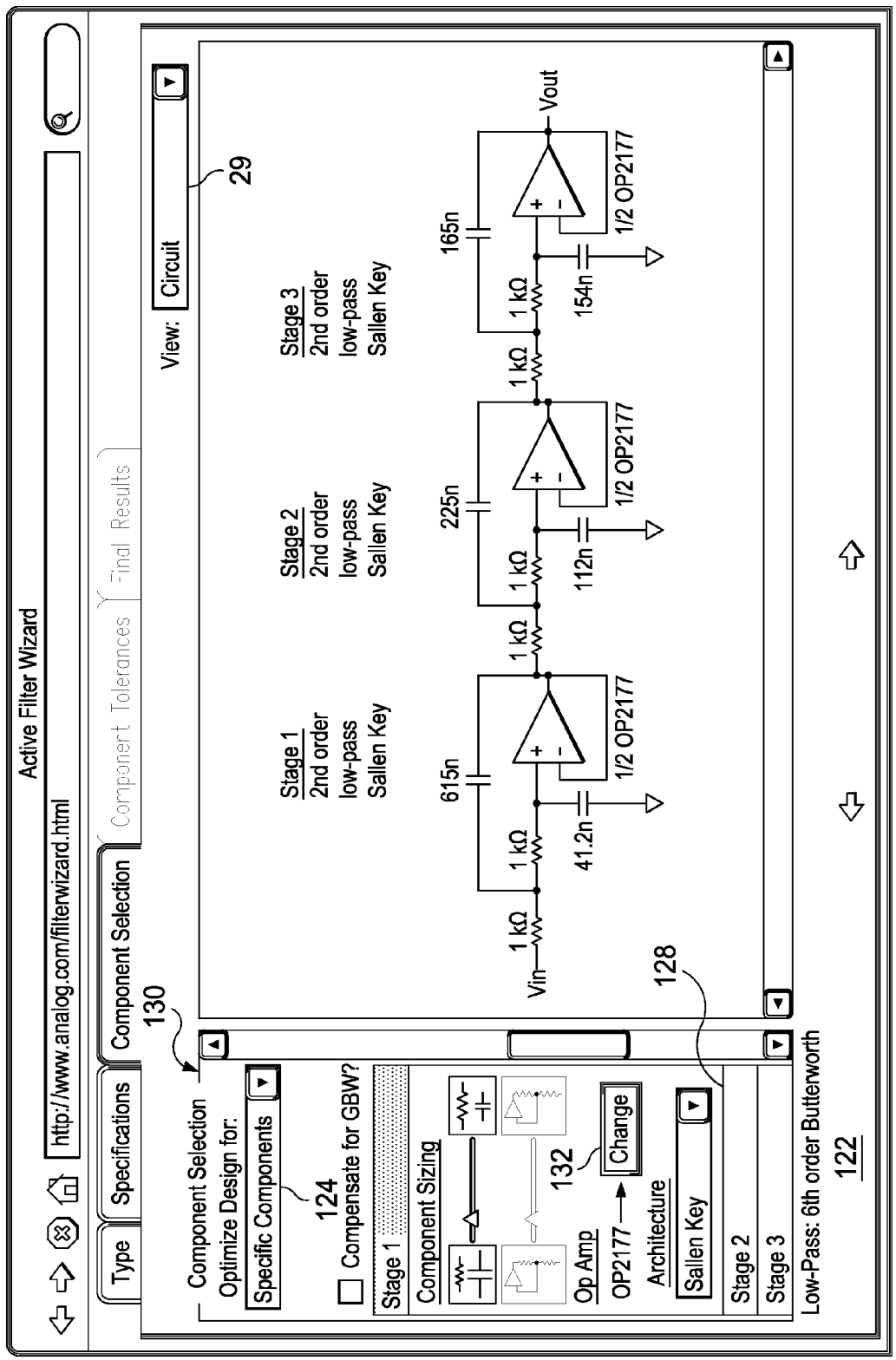

Turning to FIGS. 12A-12C, FIGS. 12A-12C are simplified diagrams showing example screen shots of example user interface 12 in an embodiment of filter design tool 10. Selecting "Specific Components" as optimization parameter 124 may bring up additional stage selection choices 128. Clicking on, or otherwise selecting, each stage may expand the selection to show additional input choices 130 as illustrated in FIG. 12B. For example, the architecture of the filter, specific op amp selection and component sizing may be selected and altered from default values (or previously saved values). The specific op amp selected may be changed suitably, for example, by selecting a "change" button 132.

Selecting "change" button 132 may bring up window area 17, as illustrated in FIG. 12C. Window area 17 may be displayed to overlap over page 122 in an example embodiment, and render page 122 inaccessible. Window area 17 may present several available op amp choices to the user, for example, in the form of a list. The op amp list may be derived from op amp database 54. The user may select one or more amps by suitably highlighting the desired item from the list, and clicking a "select" button 134. The selection process can be aborted by clicking a "cancel" button 136.

The list presented to the user may be in any suitable format. The example list presented in the FIGURE displays the gain bandwidth (GBW), and minimum and maximum supply voltage specifications for each listed op amp. A portion 138 of window area 17 may present the filter stage requirements, to assist the user in selecting a suitable op amp. Selecting the op amp may close window area 17, and user interface 12 may display page 122, showing the selected op amps in the appropriate portions. Filter design module 20 may recalculate the component values based on the selected op amp, and circuit diagram 32 may also be modified accordingly. In another embodiment, selecting "change" button 132 may bring forth a drop down menu in window area 17, which may present the list of op amps, rather than in a separate window area 17 that renders page 122 inaccessible. Various other selection methods may be presented within the broad scope of the embodiments.

Figure 13:
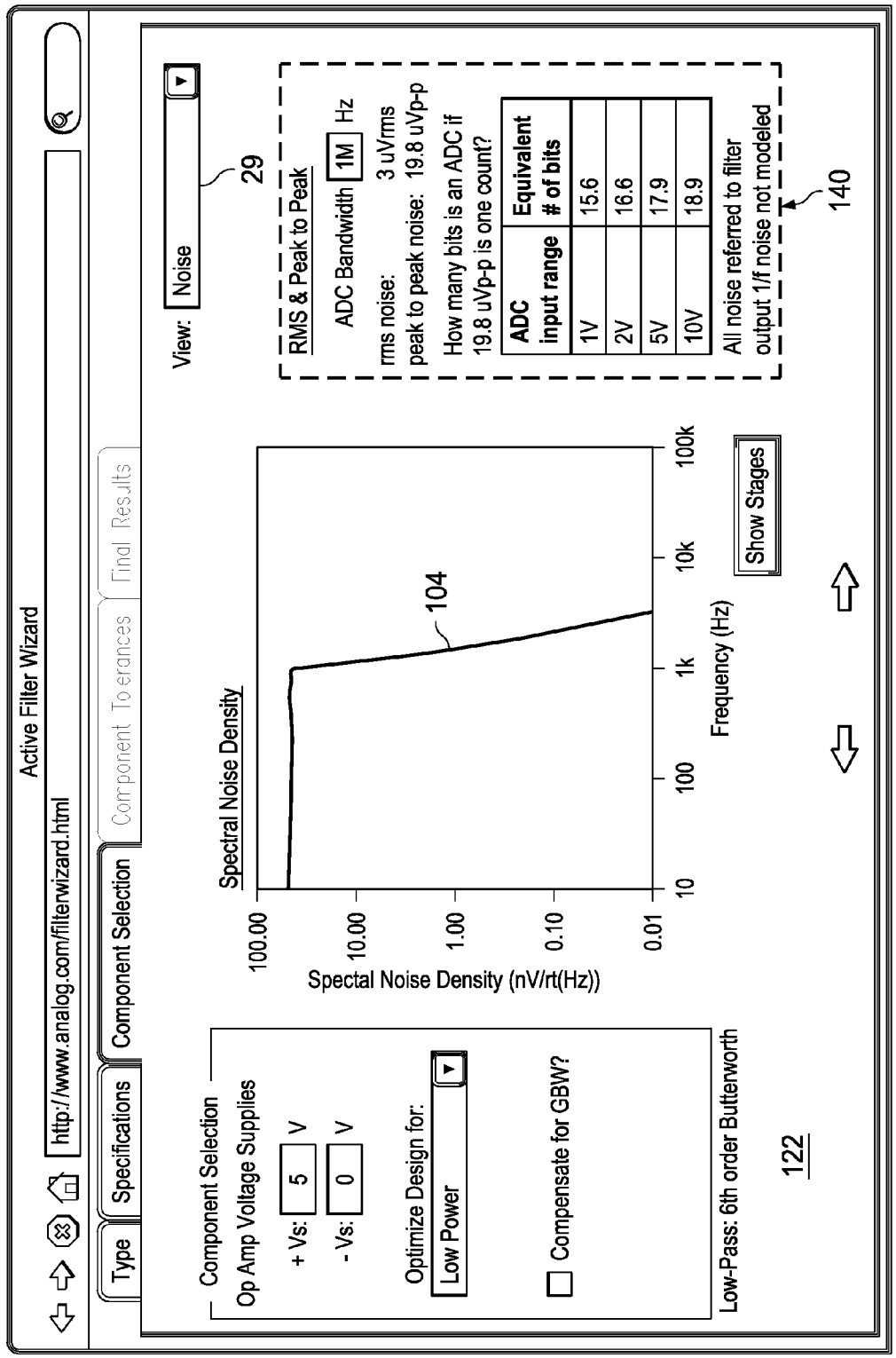
FIG. 13 is a simplified diagram illustrating yet another example screen shot associated with an embodiment of the filter design tool.

Turning to FIG. 13, FIG. 13 is a simplified diagram showing an example screen shot of example user interface 12 in an embodiment of filter design tool 10. Selecting "noise" as viewing parameter 29 in page 122 may cause the filter frequency response 104 comprising the spectral noise density, to be displayed appropriately. An explanatory text 140 and additional input choices may be displayed concurrently. Explanatory text 140 may be located so as not to overlap the design output display.

Figure 14:
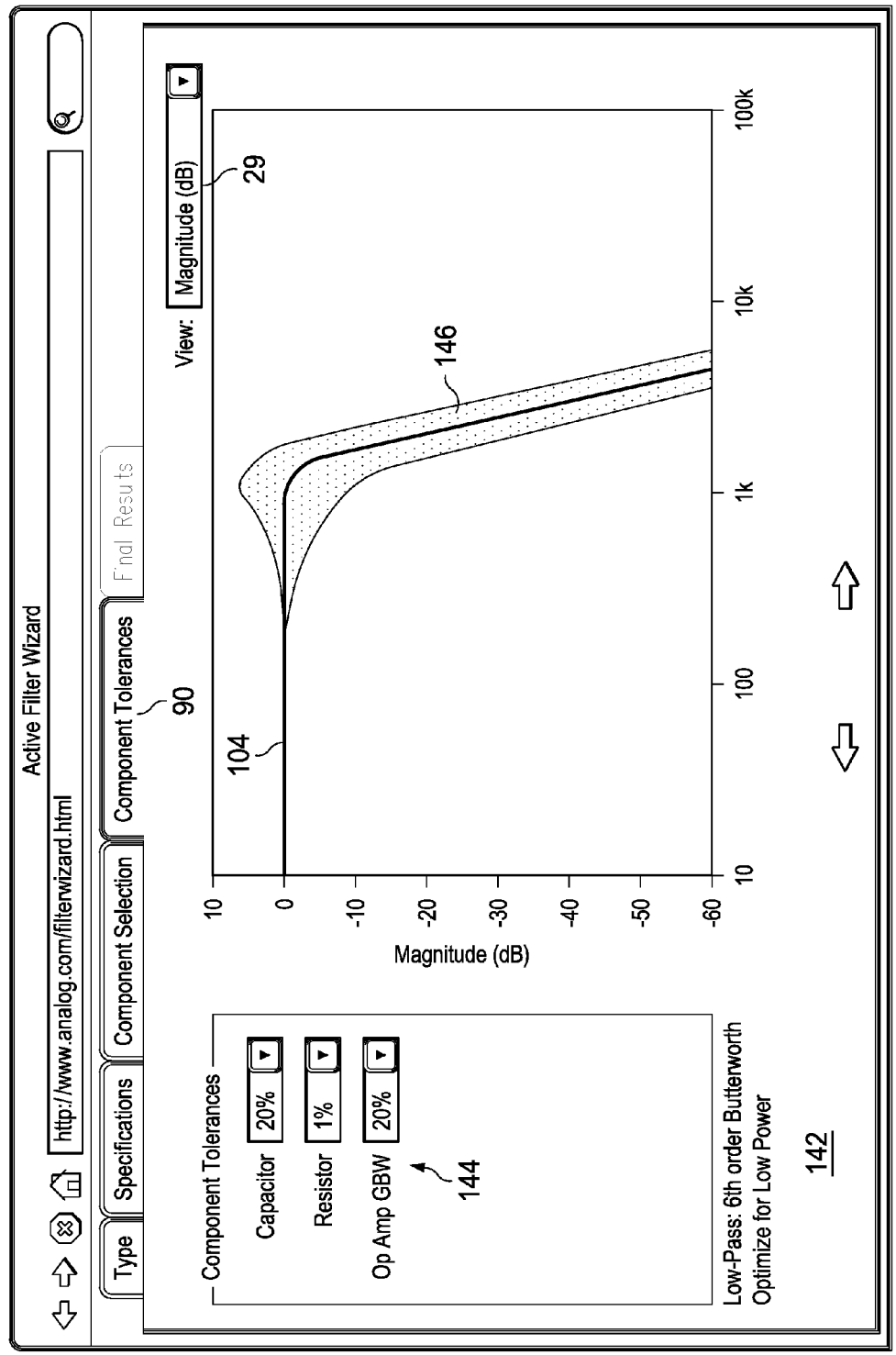
FIG. 14 is a simplified diagram illustrating yet another example screen shot associated with an embodiment of the filter design tool.

Turning to FIG. 14, FIGURE is a simplified diagram showing an example screen shot of example user interface 12 in an embodiment of filter design tool 10. Selecting tab 90 may display page 142. The user may enter component tolerances 144 for resistors, capacitors and op amps suitably. Selecting an appropriate viewing parameter 29 may cause a corresponding filter frequency response 104 to be displayed, indicating the variation (or spread) in response with the tolerances by a marked up area 146. Marked up area 146 may be displayed in a different color, or other format to indicate that it represents variations in filter behavior due to the component tolerances. Changing the component tolerances value may change the size and/or extent of marked up area 146 correspondingly.

Figure 15:
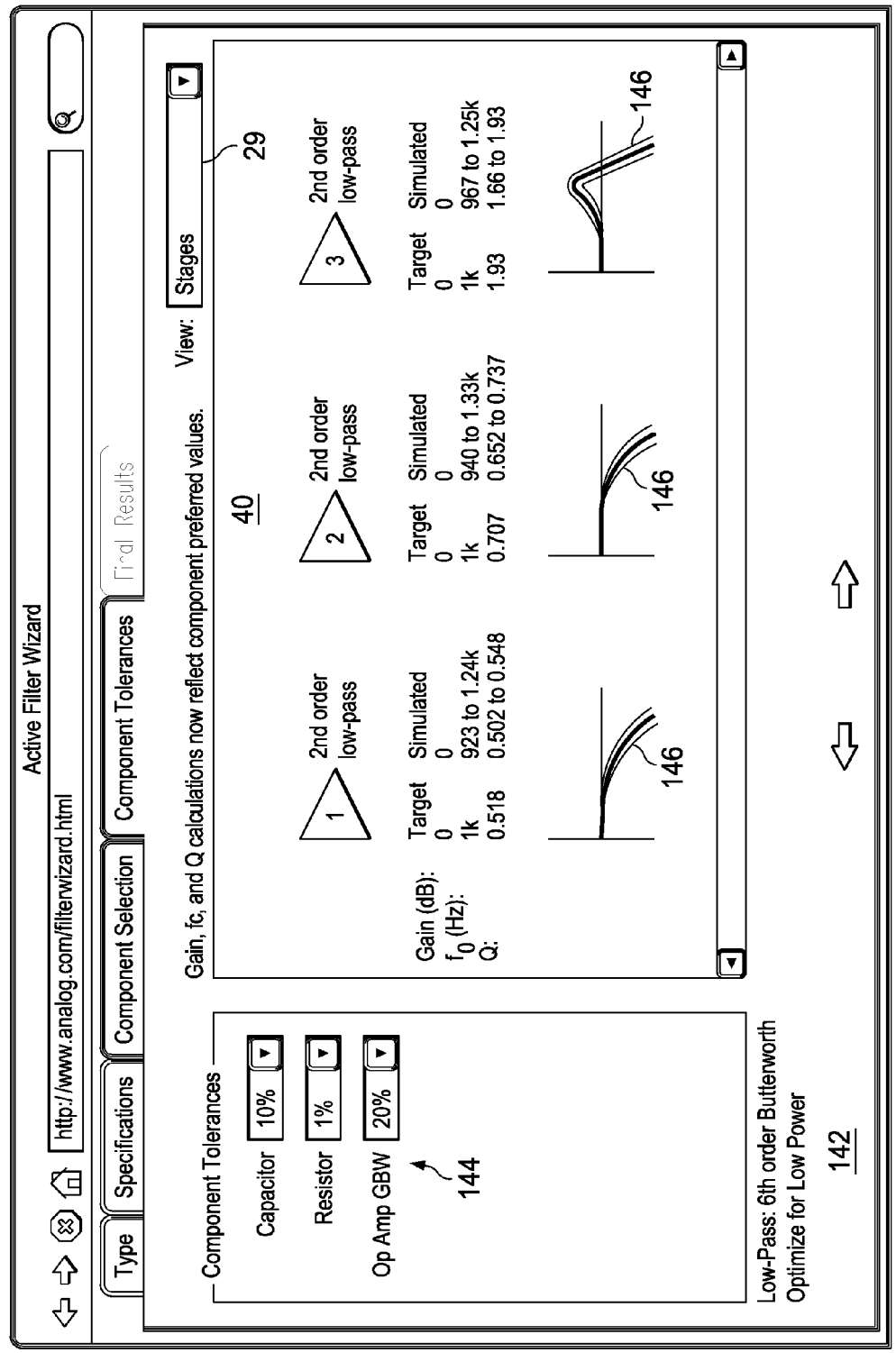
FIG. 15 is a simplified diagram illustrating yet another example screen shot associated with an embodiment of the filter design tool.

Turning to FIG. 15, FIG. 15 is a simplified diagram showing an example screen shot of example user interface 12 in an embodiment of filter design tool 10. The user may enter component tolerances 144 for resistors, capacitors and op amps suitably. Selecting "stages" as viewing parameter 29 may display the stages as block diagram 40. Variation (or spread) in response for each stage may be displayed by appropriate marked up areas 146. Marked up areas 146 in block diagram 40 may be merely for information purposes in some embodiments. In other embodiments, marked up areas 146 in block diagram 40 may indicate actual variations in filter performance with the component tolerances.

Figure 16A:
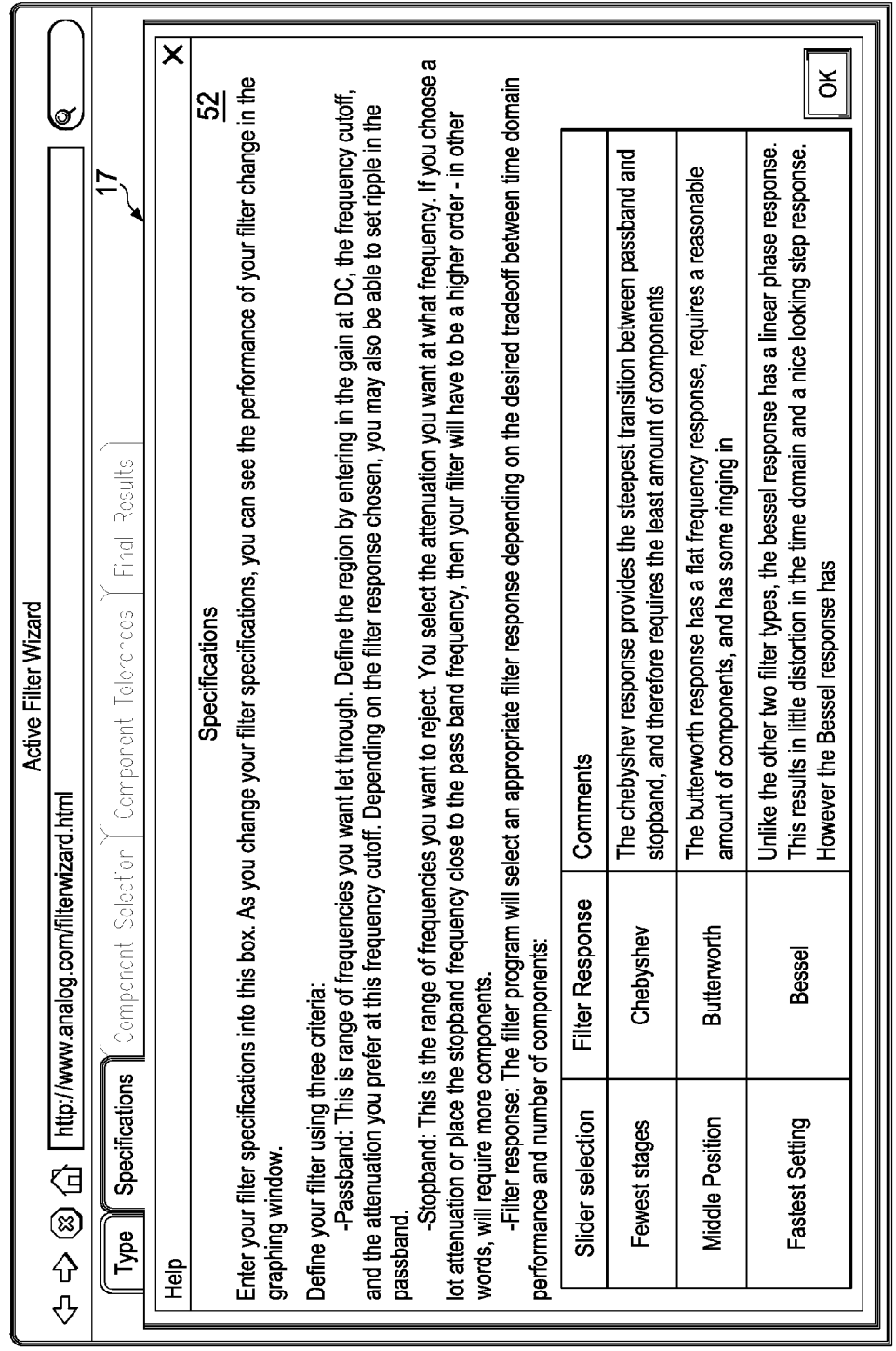
Figure 16B:
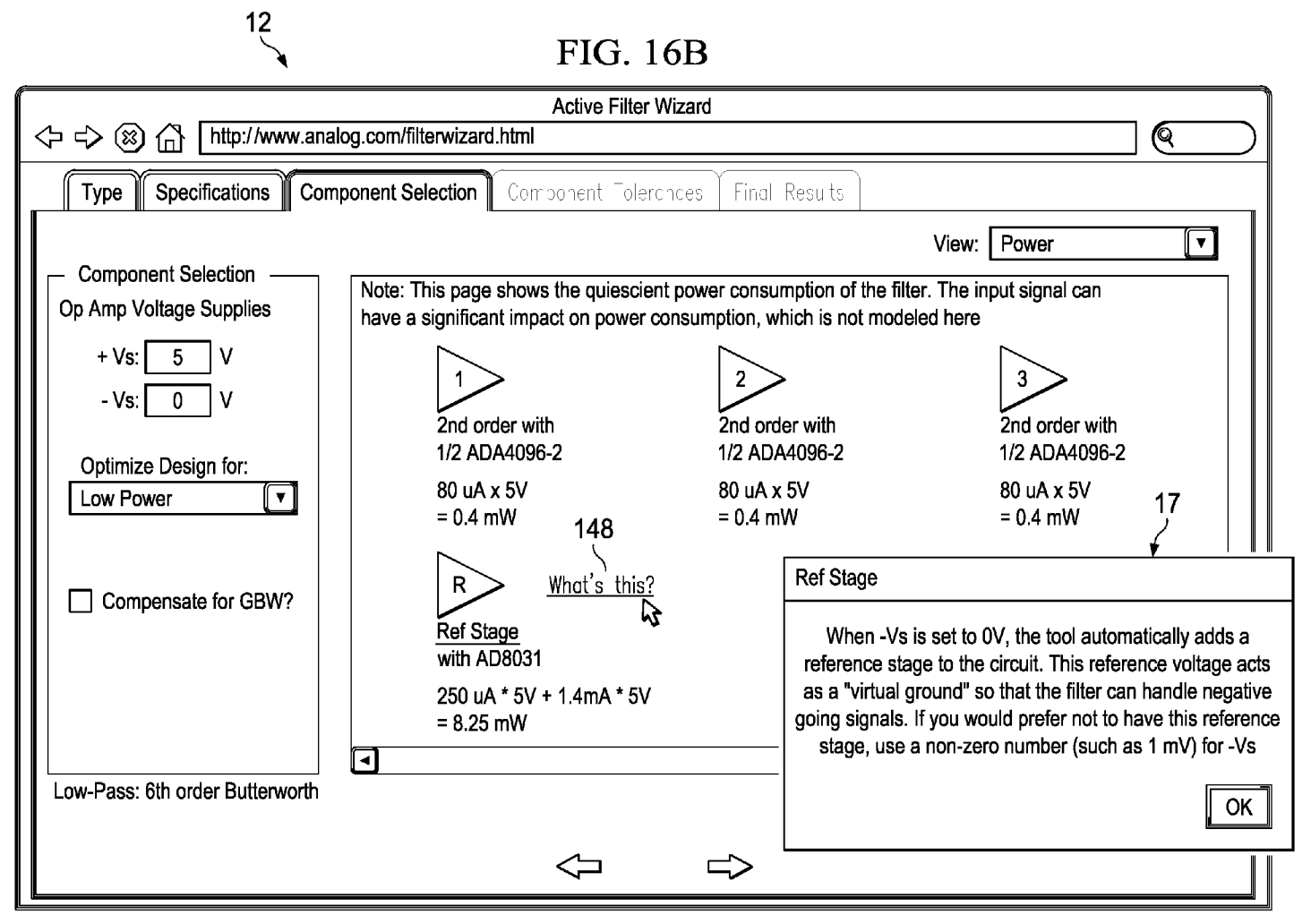

Turning to FIGS. 16A-16B, FIGS. 16A-16B are simplified diagrams showing example screen shots of example user interface 12 according to an embodiment of filter design tool 10. At any stage in the filter design process, the user may select "help" or similar informational selections, which may bring up window area 17, showing text 52. Text 52 may include information, such as the filter design process overview, tool user guide, etc. In an example embodiment, as illustrated in FIG. 16A, window area 17 may be displayed, causing the page behind to be rendered inaccessible (e.g., greyed out). In another example embodiment, as illustrated in FIG. 16B, window area 17 may be displayed as a smaller box in front of the active page, for example, when the user selects a "What's this" label 148 on the page.

Figure 17:
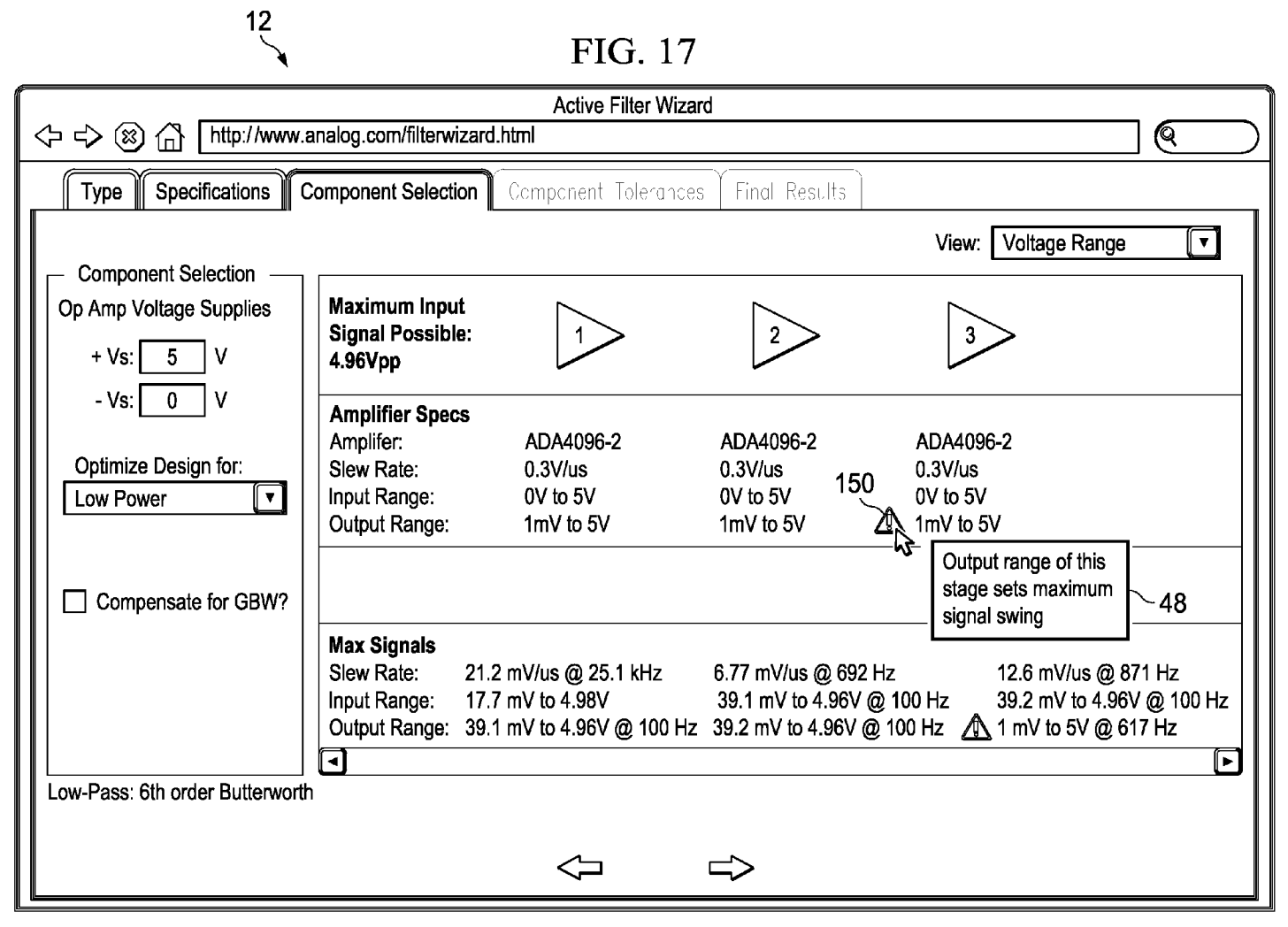

Turning to FIG. 17, FIG. 17 is a simplified diagram showing an example screen shot of example user interface 12 according to an embodiment of filter design tool 10. Clicking on (or hovering over, or otherwise selecting) an alert icon 150 may bring up alert 48 to alert the user suitably, for example, to indicate information, or potential design cliffs, etc. In the embodiment illustrated in the FIGURE, alert 48 may be displayed as a highlighted text box. Various other formats and display modes may be used within the broad scope of the embodiments.

Figure 18:
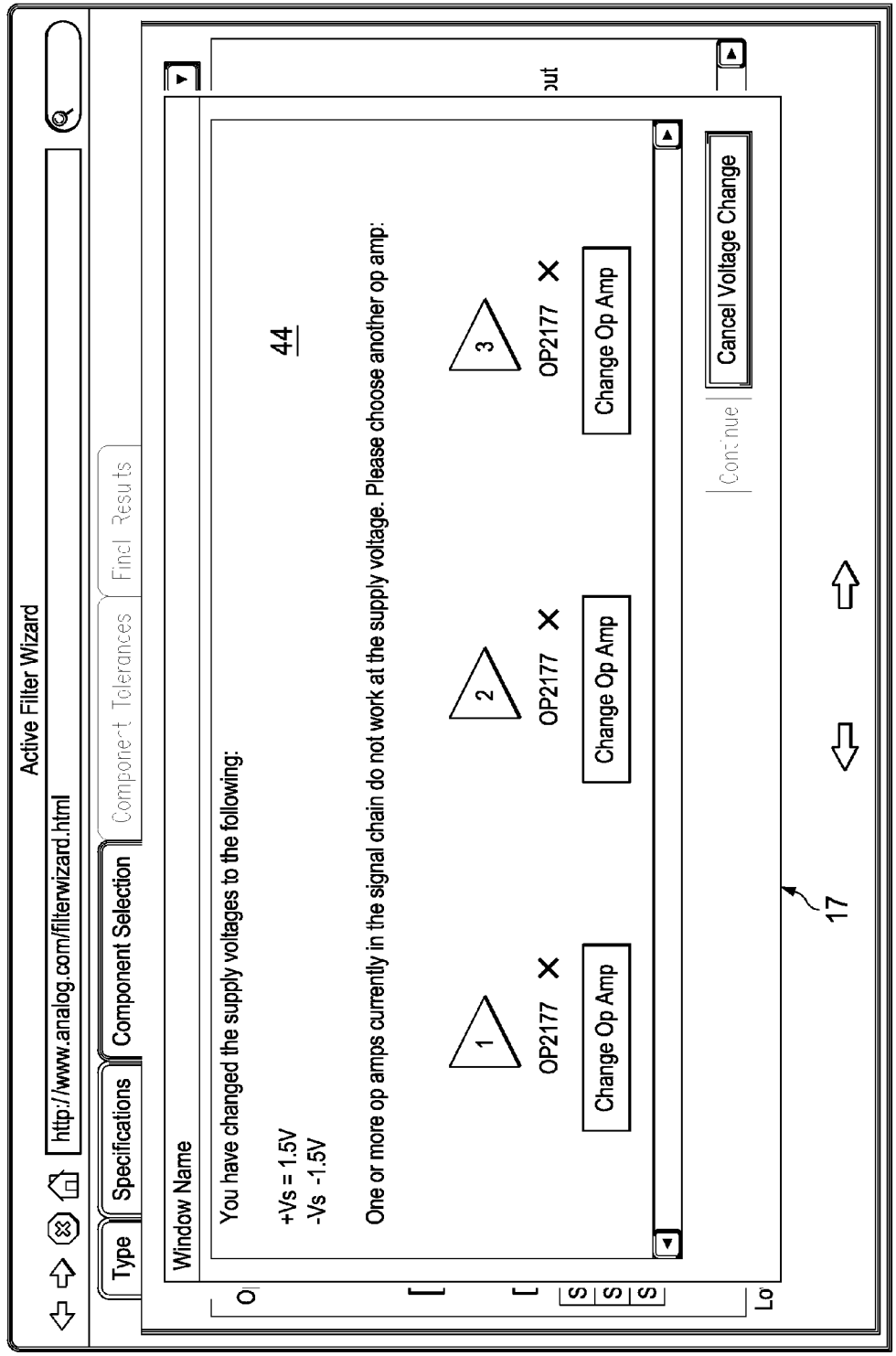
FIG. 18 is a simplified diagram illustrating yet another example screen shot associated with an embodiment of the filter design tool.

Turning to FIG. 18, FIG. 18 is a simplified diagram showing an example screen shot of example user interface 12 according to an embodiment of filter design tool 10. Any error messages may be displayed as error 44 in user interface 12 appropriately. For example, error 44 may pop up in window area 17 to indicate an error. Error 44 may include appropriate text to indicate the nature of the error, and may present the user with options to correct the error, where possible. In the example illustrated in the FIGURE, error 44 indicates that the op amp selections were erroneous, and presents the user with options to change the op amps through suitable clickable buttons. In other embodiments, error 44 may be displayed alongside the design output as appropriate. Any suitable display format and mode may be used for error 44 within the broad scope of the embodiments.

Figure 19:
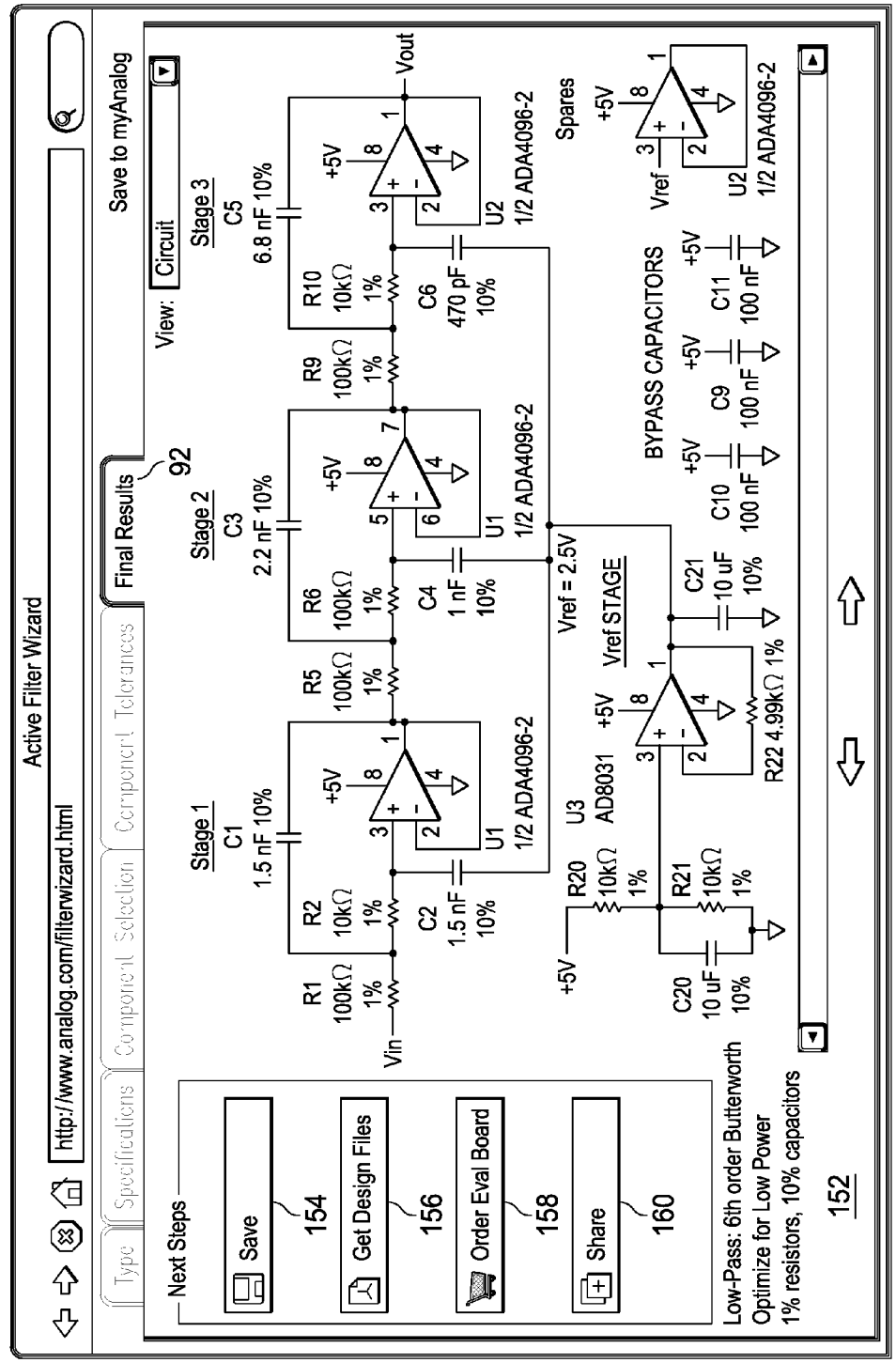
FIG. 19 is a simplified diagram illustrating yet another example screen shot associated with an embodiment of the filter design tool.

Turning to FIG. 19, FIG. 19 is a simplified diagram showing an example screen shot of example user interface 12 according to an embodiment of filter design tool 10. Selecting tab 92 may display page 152 on user interface 12, showing the final results of the filter design process. The user may be allowed to save the filter design by selecting box 154. Clicking on (or otherwise selecting the option to save) may bring up suitable windows to enable the user to enter file names, storage location, etc. The user may get design files (e.g., SPICE files) for the designed filter by selecting box 156 ("Get Design Files"). Selecting box 158 ("Order EvalBoard") may enable the user to order an evaluation board to test the designed filter. Selecting box 160 ("Share") may enable the user to share the filter design with colleagues. For example, the circuit diagram may be converted to a picture file and emailed to selected colleagues. In another example, a link to the design files may be included in the email, to permit the selected colleagues to bring up filter design tool 10 and view the designed filter. Various other options associated with the final filter design may be presented to the user within the broad scope of the embodiments.

Turning to FIG. 20, FIG. 20 is a simplified diagram showing an example screen shot of example user interface 12 according to an embodiment of filter design tool 10. Selecting box 158 may bring up window area 17, which may display available evaluation boards that may be ordered. Filter design tool 10 may access an inventory database and pull up the available evaluation boards, whether they are in stock, their prices, and other relevant information to assist the user in selecting a suitable evaluation board.

Figure 21:
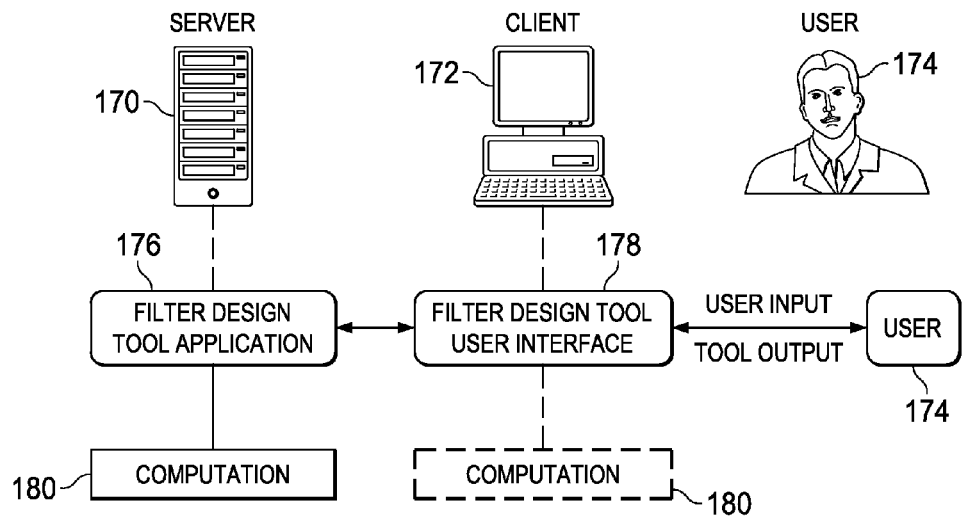
FIG. 21 is a simplified block diagram illustrating example details of an embodiment of the filter design tool.

Turning to FIG. 21, FIG. 21 is a simplified block diagram illustrating an example configuration according to an embodiment of filter design tool 10. A server 170 may communicate with a client 172, which may be operated on (e.g., used by) a user 174. A filter design tool application 176 may be hosted at server 170, and a filter design tool user interface 178 may be displayed at client 172. For example, filter design tool user interface 178 may be a web browser through which user 174 interacts with filter design tool 10.

In a general sense, the client/server paradigm describes the relationship between two computer programs in which one program, the client, makes a service request from another program, the server, which fulfills the request. The client/server paradigm can be used by programs within a single computer (or computing device) and in a network. In a network, the client/server model provides a convenient way to interconnect programs that are distributed efficiently across different locations.

User 174 may open (or otherwise access) filter design tool user interface 178 through appropriate commands. For example, user 174 may enter a Uniform Resource Locator (URL) corresponding to filter design tool user interface 178 on a web browser. Client 172 may communicate the request to server 170, which may instruct client 172 to open and display filter design tool user interface 178 accordingly. In another example embodiment, user 174 may select (e.g., double click) and open filter design tool user interface 178. Filter design tool user interface 178 may cause client 172 to open communication with filter design tool application 176 on server 170.

User 174 may enter user input (e.g., filter parameters 18 and viewing parameters 29) in filter design tool user interface 178. In an example embodiment, filter design tool user interface 178 may perform computation 180 and display tool output (e.g., design output) accordingly. Filter design tool user interface 178 may establish a network connection with filter design tool application 176, and pull relevant files and other information therefrom. The files and other information may be stored locally on client 172. Filter design tool user interface 178 may perform computation 180 in response to various user inputs and display design output accordingly. Subsequently, if the network connection with server 170 is disrupted, disabled or is otherwise broken, filter design tool user interface 178 may not experience any loss of performance, and may continue to perform computation 180 as before.

In another example embodiment, filter design tool user interface 178 may co-operate actively with filter design tool application 180. Filter design tool user interface 178 may communicate the user input to server 170. Filter design tool application 176 may perform computation 180, and communicate the result back to client 172. Client 172 may thereupon display the result (e.g., design output) on filter design tool user interface 178. In yet another embodiment, filter design tool user interface 178 may perform some computation 180, whereas other computation 180 may be performed by filter design application 176 on server 170.

When filter design tool user interface 178 performs computation 180, the results may be displayed almost instantaneously; when filter design tool application 176 performs computation 180, the results may be displayed according to the communication conditions between client 172 and server 170. For example, if the network connection between client 172 and server 170 experiences significant latency and traffic congestion, the results may be delayed in being displayed to user 174 at client 172.

In the network based implementation illustrated in the FIGURE, filter design tool 10 may include a configuration capable of transmission control protocol/Internet protocol (TCP/IP) communications for the electronic transmission or reception of data packets in a network. Filter design tool 10 may also operate in conjunction with a User Datagram Protocol/Internet Protocol (UDP/IP) or any other suitable protocol, where appropriate and based on particular needs. In addition, gateways, routers, switches, and any other suitable nodes (physical or virtual) may be used to facilitate electronic communication between various nodes in the network.

The network environment may be configured over a physical infrastructure that may include one or more networks and, further, may be configured in any form including, but not limited to, LANs, wireless local area networks (WLANs), VLANs, metropolitan area networks (MANs), wide area networks (WANs), VPNs, Intranet, Extranet, any other appropriate architecture or system, or any combination thereof that facilitates communications in a network. In some embodiments, a communication link may represent any electronic link supporting a LAN environment such as, for example, cable, Ethernet, wireless technologies (e.g., IEEE 802.11x), ATM, fiber optics, etc. or any suitable combination thereof. In other embodiments, communication links may represent a remote connection through any appropriate medium (e.g., digital subscriber lines (DSL), telephone lines, T1 lines, T3 lines, wireless, satellite, fiber optics, cable, Ethernet, etc. or any combination thereof) and/or through any additional networks such as a wide area networks (e.g., the Internet).

Figure 22:
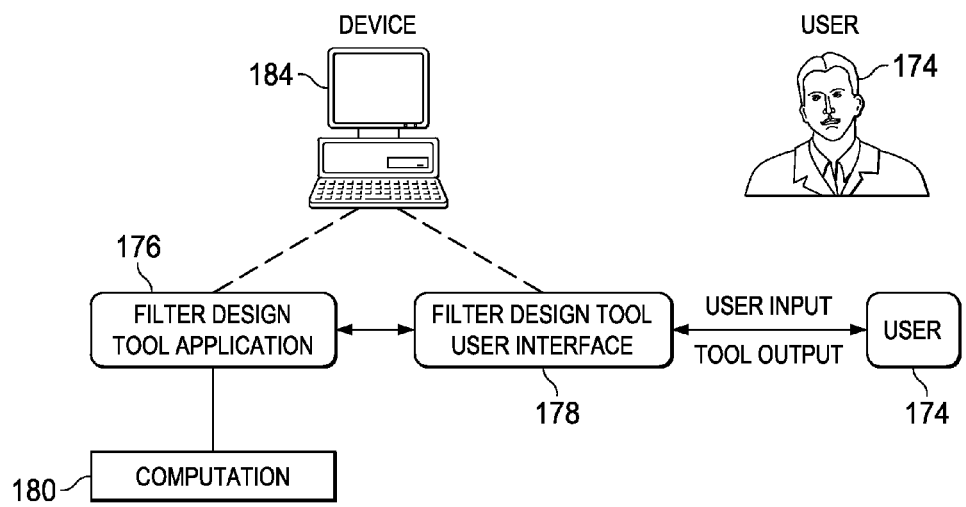
FIG. 22 is a simplified block diagram illustrating example details of an embodiment of the filter design tool.

Turning to FIG. 22, FIG. 22 is a simplified block diagram illustrating an example configuration according to an embodiment of filter design tool 10. According to the example configuration, filter design tool application 176 and filter design tool interface 178 may be hosted at (or accessed at) device 184. Device 184 may be any suitable computing device (e.g., computer, server, smart phone, etc.) that has computing power (e.g., processors, memory, etc.) to execute instructions provided by filter design tool application 176 and filter design tool interface 178, and cause design output and other information to be displayed on a monitor accessible to (or intelligible to) user 174. User 174 may open filter design tool interface 178 and enter filter parameters, viewing parameters, etc., and in general, interact with filter design tool interface 178. Computation 180 may be performed by filter design tool application 176 in device 184.

Figure 23:
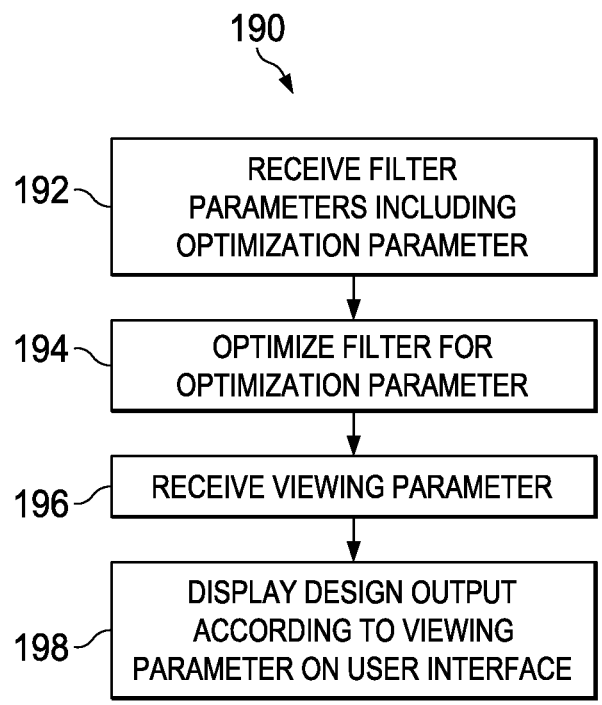
FIG. 23 is a simplified flow diagram illustrating example operations that may be associated with an embodiment of the filter design tool.

Turning to FIG. 23, FIG. 23 is a simplified flow diagram illustrating example operations that may be associated with embodiments of filter design tool 10. Operations 190 include 192, at which filter parameters 18 are received at user interface 12. Filter parameters 18 include an optimization parameter (e.g., noise, power, voltage range, etc.). At 194, a filter may be designed optimized for the optimization parameter. At 196, viewing parameter 29 may be received. At 198, a design output (e.g., filter frequency response 104, circuit diagram 32, block diagram 40, etc.) may be suitably displayed in user interface 12.

Figure 24:
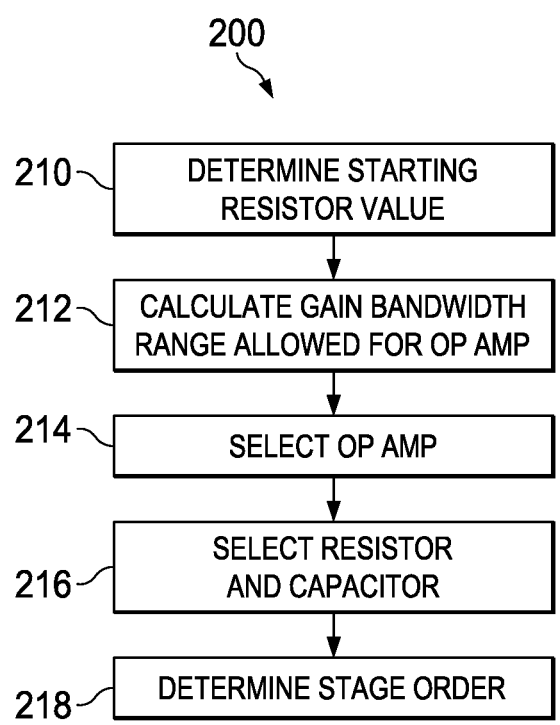
FIG. 24 is a simplified flow diagram illustrating other example operations that may be associated with an embodiment of the filter design tool.

Turning to FIG. 24, FIG. 24 is a simplified flow diagram illustrating example operations that may be associated with embodiments of filter design tool 10. Operations 200 include 212, at which a starting (e.g., initial) resistor value may be determined by filter design module 20. At 212, a gain bandwidth range allowed for the op amps (for each stage) may be calculated. Gain bandwidth range may be calculated from the filter specifications provided in filter parameters 18. At 214, filter design module 20 may select a suitable op amp from op amp database 54 that meets the gain bandwidth range computed in the previous operation at 212.

At 216, suitable resistors and capacitors may be selected (e.g., component values may be calculated). Resistor and capacitor values may be based on the optimization parameter selected by the user. Embodiments of filter design tool 10 may choose small resistors and bigger capacitors if optimization parameter is "Noise" and vice versa if optimization parameter is "Power." "Voltage Range" may indicate a compromise in component values between the component values computed according to the other two optimization parameters. At 218, a stage order may be determined. If optimization parameter is "noise," or "voltage range," embodiments of filter design tool 10 may rearrange the filter stage order to get a low noise filter performance or high voltage range filter performance, respectively. According to one embodiment, rearranging may be achieved in a brute force manner by computing the noise (or voltage range) of stage combinations and picking the stage combination with the lowest noise (or largest voltage range). In various embodiments, as operations 200 is being executed, Components object 66 may be read from, written to, and otherwise accessed to display appropriate circuit diagram 32, graph 36, block diagram 40, error 44, alert 48, text 52, filter frequency response 104, etc., suitably, and based on particular needs.

Turning to FIG. 25, FIG. 25 is a simplified pseudo-code providing example operations that may be associated with calculating an initial resistor value according to embodiments of filter design tool 10. Algorithm 220 indicates that a minimum natural frequency $f_p$ of all stages in the filter may be found from filter parameters 18 and otherwise, using any suitable method. Certain maximum frequency ($f_{max}$), minimum resistor values ($R_{min}$) and maximum resistor values ($R_{max}$) may be set for each type of optimization, namely, optimization for noise, for power, and for voltage range, according to table 222. A minimum of a product of square root of $f_{max}$ and $R_{min}$, and $R_{max}$ may be determined. The computer minimum may be divided by the minimum natural frequency $f_p$ to obtain the initial resistor value.

Turning to FIG. 26, FIG. 26 is a simplified pseudo-code providing example operations that may be associated with determining minimum op amp performance requirements according to embodiments of filter design tool 10. The gain bandwidth range (GBW) may be calculated from filter parameter 18 entered by the user. The calculated GBW may be modified according to the optimization parameter. For example, if the optimization parameter is "Power" the GBW may indicate a lower frequency than it would be if the optimization parameter were "Noise" or "Voltage Range." Algorithm 224 may be used to convert filter parameters 18 into minimum GBW, $R_{out}$ (op amp output resistance), and slew rate (maximum rate of change of the output voltage) requirements for the op amps used in the filter. Algorithm 224 may be used when picking an op amp for the user, and for screening out inappropriate op amps when the user chooses an op amp.

According to algorithm 224, for each stage, the minimum GBW, minimum slew rate, and maximum $R_{out}$/GBW allowed may be determined. The minimum op amp GBW may be set to the maximum op amp GBW of all stages; the maximum $R_{out}$/GBW may be set to the minimum op amp RoutOverGBW (max $R_{out}$/GBW allowed for the op amp so that attenuation is as specified at (or one decade beyond) stopband frequency) of all stages; and minimum op amp slew rate may be set to the maximum op amp slew rate of all stages. In an example embodiment, minimum slew rate may be set to 0 for all order and type of filters, although other values may be suitably calculated based on methods known in the art.

Figure 27A:
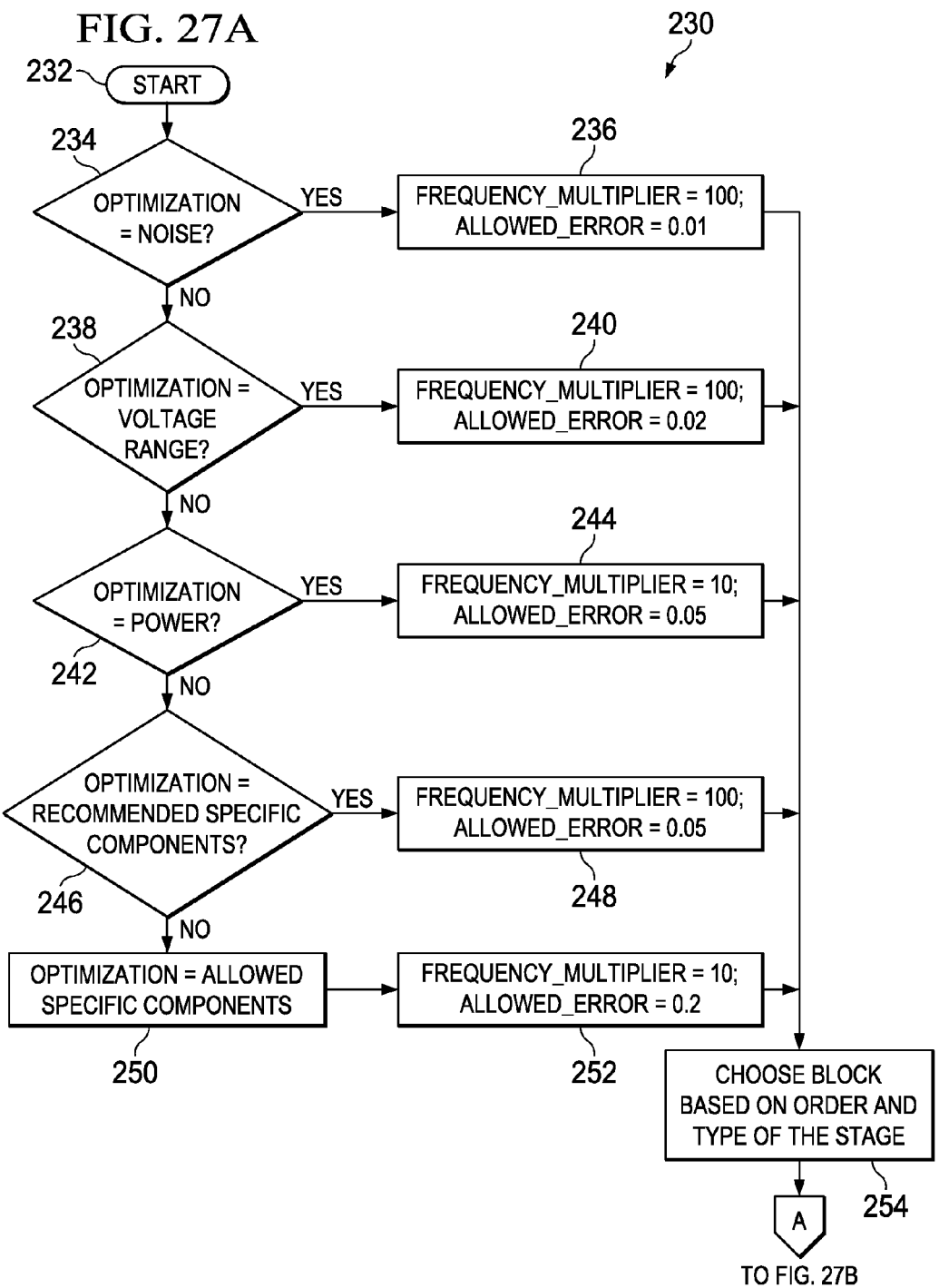
FIGS. 27A, 27B and 27C are simplified flow diagrams illustrating yet other example operations that may be associated with an embodiment of the filter design tool.
Figure 27B:
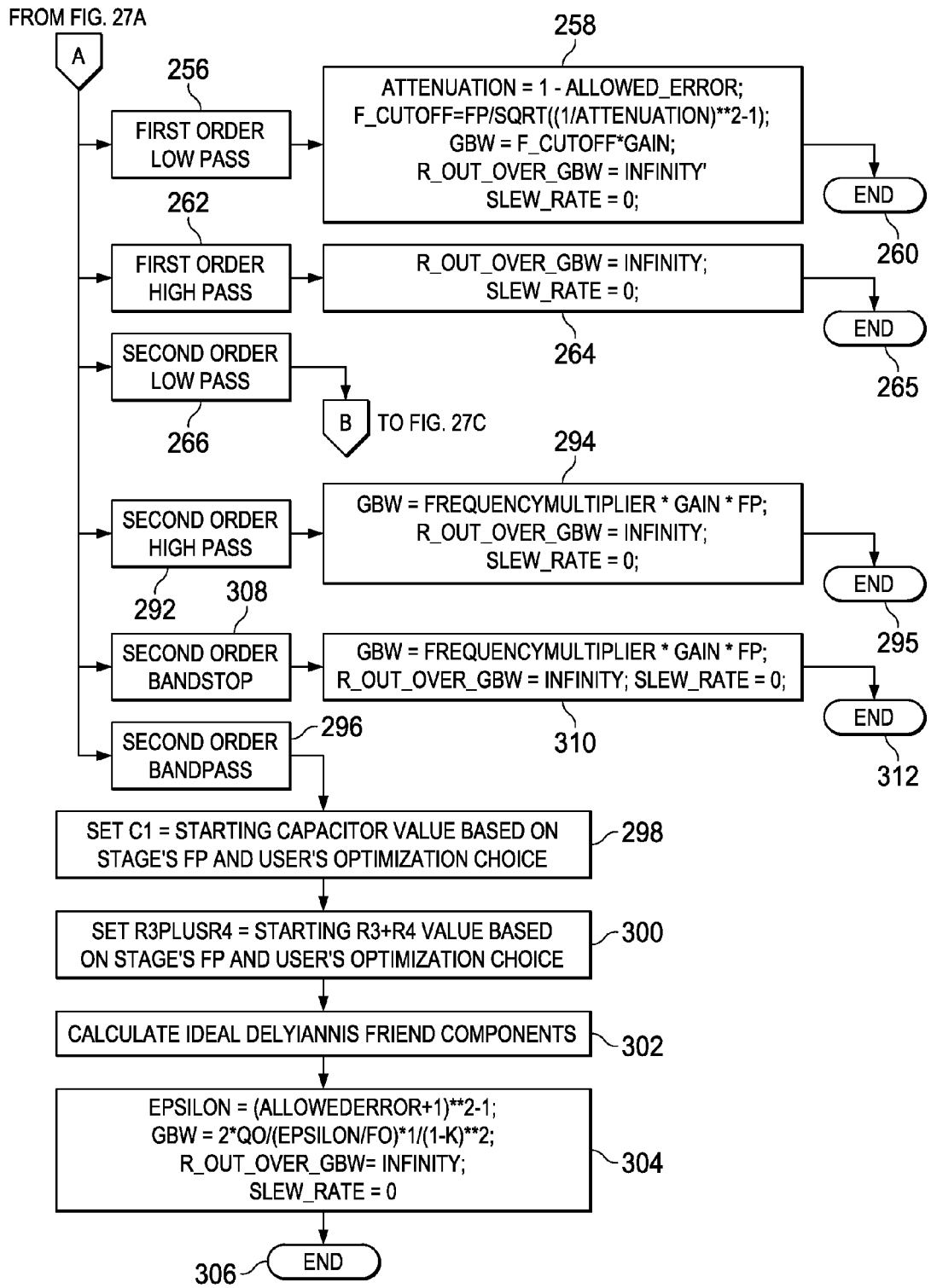
Figure 27C:
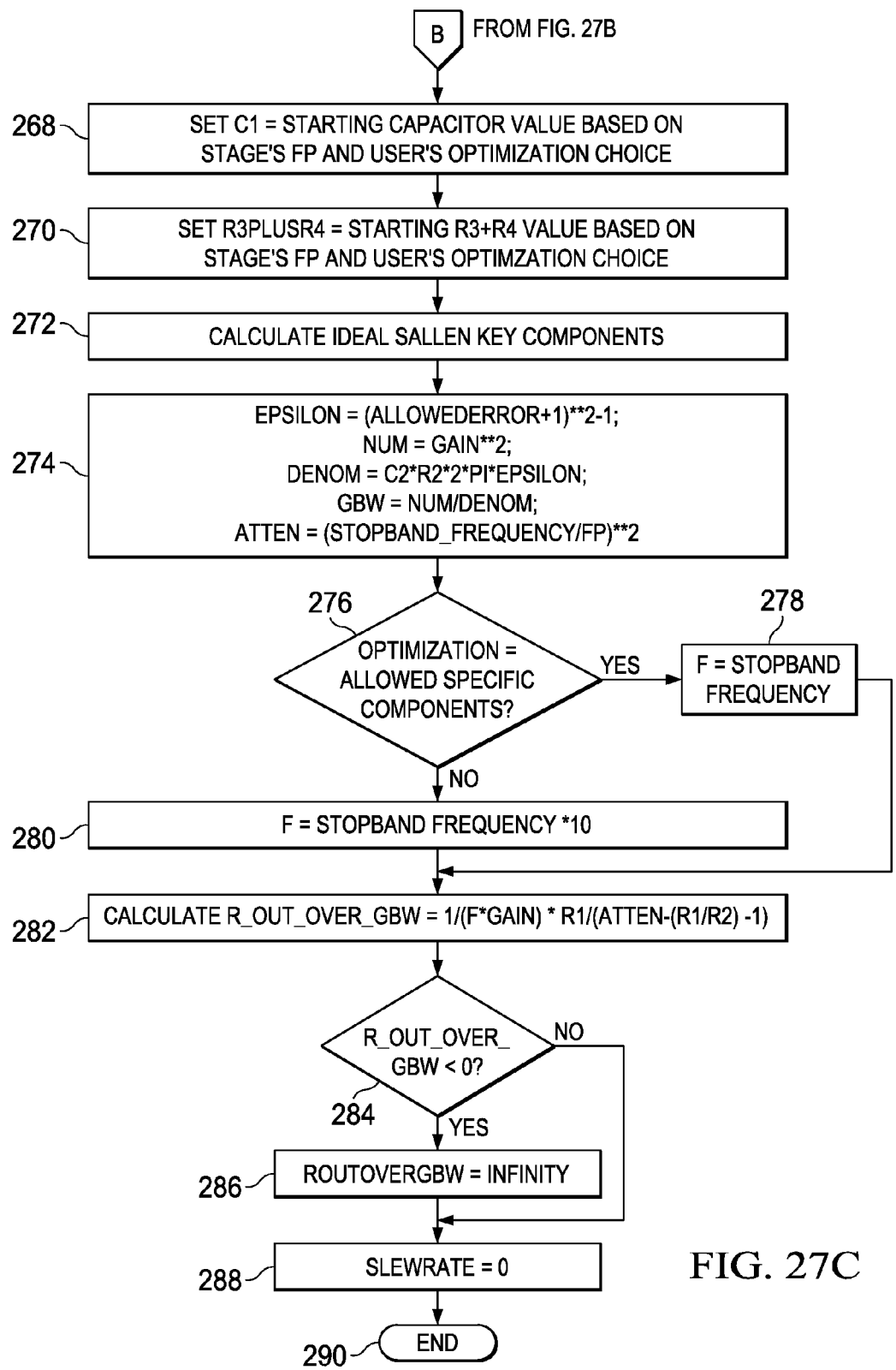

Turning to FIGS. 27A-27C, FIGS. 27A-27C are simplified flow diagrams illustrating example operations that may be associated with selecting op amp requirements for one stage according to an embodiment of filter design tool 10. In FIG. 27A, operations 230 may start at 232, at which the calculating GBW range for the op amps process is triggered (or called as a function, etc. during execution). At 234, a determination may be made whether filter parameters 18 indicate optimization for noise. If optimization for noise is indicated, a frequency_multiplier variable may be set to 100 and allowed_error variable may be set to 0.01 (1% error) at 236. If optimization for noise is not indicated, a determination may be made at 238 whether filter parameters 18 indicate optimization for voltage range. If optimization for voltage range is indicated, the frequency_multiplier variable may be set to 100 and the allowed_error variable may be set to 0.02 (2% error) at 240.

If optimization for voltage range is also not indicated, a determination may be made at 242 whether filter parameters 18 indicate optimization for power. If optimization for power is indicated, the frequency_multiplier variable may be set to 10 and the allowed_error variable may be set to 0.05 (5% error) at 244. If optimization for power is also not indicated, a determination may be made at 246 whether filter parameters 18 indicate optimization according to recommended specific components. If optimization according to recommended specific components is indicated, the frequency_multiplier variable may be set to 100 and the allowed_error variable may be set to 0.05 (5% error) at 248. If optimization according to recommended specific components is also not indicated, optimization according to allowed specific components may be set at 250, and the frequency_multiplier variable may be set to 10 and the allowed_error variable may be set to 0.02 (2% error) at 252. At 254, a suitable calculation block (or object) may be selected based on order and type of stage.

Turning to FIG. 27B, if a first order low pass filter is indicated at 256, then at 258, variables for filter design can be appropriately calculated as follows: attenuation may be calculated to be 1 minus the allowed_error; cutoff frequency ($f_{cutoff}$) may be calculated to be $$f_{cutoff} = \frac{f_p}{\sqrt{\left(\frac{1}{\text{attenuation}}\right)^2 - 1}};$$

GBW may be calculated to $f_{cutoff} \times$ gain; R_Out_Over_GBW may be set to ∞ (infinity); and slew rate may be set to 0. The operations may end at 260. If the stage type and order indicate a first order high pass filter at 262, at 264, R_Out_Over_GBW may be set to ∞ and slew rate may be set to 0, and the operations may end at 265.

If the stage order and type indicate a second order low pass filter at 266, turning to FIG. 27C, at 268, an initial capacitor value C1 may be set to a value based on the stage's minimum natural frequency $f_p$ and user's optimization choice (e.g., noise, power, or voltage range). At 270, variable R3plusR4 (R3+R4) may be set according to the stage's minimum natural frequency $f_p$ and user's optimization choice. At 272, ideal Sallen-Key component values may be calculated by any suitable method. At 274, variables for the Sallen-Key stage may be calculated as follows:

$$\varepsilon = (\text{allowed\_error} + 1)^2 - 1;$$

$$GBW = \frac{gain^2}{C2 \times R2 \times 2 \times \pi \times \varepsilon};$$

$$\text{attenuation} = \left(\frac{\text{stopband\_frequency}}{f_p}\right)^2.$$

In various embodiments, it may be ensured that $R_{out}$ allows for a full 20 dB per decade attenuation one decade beyond stop frequency. At 276, a determination may be made if optimization is according to allowed specific components. If yes, at 278, frequency f may be set to the stopband frequency. If not, at 280, frequency f may be set to the stopband frequency×10. At 282, R_out_over_GBW may be calculated as follows:

$$R\_out\_over\_GBW = \frac{1}{f \times gain} \times \frac{R1}{\left(\text{attenuation} - \frac{R1}{R2}\right) - 1}$$

At 284, a determination may be made if R_out_over_GBW is negative. If attenuation is a small number, and attenuation provided by R2/(R1+R2) is quite strong, R_out_over_GBW may be determined to be a negative number according to the equation at 282. In such cases $R_{out}$ of op amp may not matter because R1 and R2 take care of substantially all the attenuation. The negative value for R_out_over_GBW may indicate that the op amp output resistance may not be relevant for the particular filter design. Because negative numbers in downstream calculations may not be allowed, R_out_over_GBW may be set to ∞ at 286 if the computed value is less than 0. At 288, the slew rate may be set to 0 and the operations may end at 290.

Turning back to FIG. 27B, if the stage order and type indicate a second order high pass filter at 292, at 294, GBW may be calculated as a product of frequency_multiplier, gain and $f_p$; R_out_over_GBW may be set to ∞; and slew rate may be set to 0. The operations may end at 295. If the stage order and type indicate a send order bandpass filter at 296, at 298, an initial capacitor value C1 may be set to a value based on the stage's minimum natural frequency $f_p$ and user's optimization choice (e.g., noise, power, or voltage range). At 300, variable R3plusR4 (R3+R4) may be set according to the stage's minimum natural frequency $f_p$ and user's optimization choice. At 302, component values according to an ideal Delyiammis Friend stage may be calculated. At 304, variables for the Delyiammis Friend stage may be calculated as follows:

$$\varepsilon = (\text{allowed\_error} + 1)^2 - 1;$$

$$GBW = 2 \times \frac{Q_0}{\left(\frac{\varepsilon}{f_0}\right) \times \frac{1}{(1-K)^2}};$$

$$R\_out\_over\_GBW = \infty$$

$$slew\_rate = 0$$

The process may end at 306. If the stage order and type indicate a second order bandstop filter at 308, at 310, GBW may be calculated as a product of frequency_multiplier, gain and $f_p$; R_out_over_GBW may be set to ∞; and slew rate may be set to 0. The operations may end at 312. Operations 230 may be repeated for all stages individually.

Turning to FIG. 28, FIG. 28 is a simplified pseudo-code indicating example operations that may be associated with selecting an op amp according to an embodiment of filter design tool 10. Embodiments of filter design tool 10 may determine op amps in op amp database 54 that meet the calculated gain bandwidth range (e.g., determined according to operations 230). Embodiments of filter design tool 10 may also remove op amps from a user selected list if they cannot meet other parameters, for example, if the selected op amps do not fit on an evaluation board. After an op amp selection list is determined, embodiments of filter design tool 10 may pick a suitable op amp for the optimization according to algorithm 320.

According to algorithm 320, substantially all op amps in op amp database 54 that meet minimum GBW requirements (e.g., minGBW<op amp GBW≤10×minGBW) may be selected. From this list, any op amps that do not meet allowed criteria (e.g., fit on evaluation board, etc.) as indicated by the equation Op Amp Not Allowed?=TRUE may be removed. Allowed criteria may include, by way of examples and not as limitations, the op amp is not available in op amp database 54; technical support does not exist for the op amp; GBW is too low; supply voltage is too low or too high; op amp cannot support available evaluation boards; package is incompatible with available evaluation boards; output impedance is too high (e.g., maxRoutOverGBW<opamp·$R_{out}$/opamp·GBW); slew rate is too low (e.g., opamp·SlewRate<minSlewRate); there is not enough positive input or output range (e.g., (+Vs−opamp·InputHeadroomV+−0.1≤RefV), (+Vs−opamp·OutputHeadroom V+−0.1≤RefV) with ±100 mV input output headroom limits); there is not enough negative input or output range (e.g., (−Vs+opamp·InputHeadroomV−+0.1≥RefV), (−Vs+opamp·OutputHeadroomV−+0.1≥RefV)); etc.

If no op amps meet the criteria, multiply minGBW by 10 and repeat until at least one op amp meets the criteria or minGBW exceeds 10 GHz. If minGBW reaches 10 GHz with no op amp meeting the criteria, the user may be notified that no op amps can be found that meet the design parameters (e.g., filter parameters 18). If the user's supply voltage range is less than 5V, or greater than 10V, algorithm 320 indicates that a suggestion may be made to the user (e.g., in appropriate window area 17, or text) that setting the upper supply voltage value to +5V and lower supply voltage value to 0V or −5V may yield better results.

On the other hand, if at least one op amp is found, then from the remaining list, the following calculations may be performed. If the user has selected optimization according to power, then the op amp with the lowest supply current (e.g., opamp·SupplyCurrent) may be selected. If the user has selected optimization according to noise, then the following calculations may be performed. Variable R3plusR4 may be obtained using smallest $f_p$ value from the array of stage specifications for each op amp on the list. Noise may be computed to be:

$$noise = \sqrt{(opamp \cdot Vnoise)^2 + (R3plusR4 \times opamp \cdot Inoise)^2}$$

and the op amp with the lowest noise may be selected.

If the user has selected optimization according to voltage range, the total gain may be determined by multiplying gain from all stages together for each op amp in the list. A voltage room (e.g., In Room, OutRoom) may be calculated and value of variable Room determined, for example, Room=minimum of (InRoom, OutRoom/TotalGain). Voltage Room may be a function of the op amp's headroom, which is a measure of how close the input and output of the op amp can swing to the supply rails (e.g., an op amp with ±0.8 V of headroom can swing to within 0.8 V of the supply voltage). The op amp from the list with the biggest Room may be selected.

Turning to FIG. 29, FIG. 29 is a simplified pseudo-code indicating example operations that may be associated with determining the voltage room according to an embodiment of filter design tool 10. In general, an op amp's headroom can be determined from the datasheet specifications or performance plots of the op amp. According to algorithm 322, if lower supply voltage (−Vs) is 0, value of variable RefV may be set to half of upper supply voltage; otherwise, RefV may be set to 0. Input headroom is the difference between the input common-mode voltage range and the supply voltage and may be computed to be InRoom=Minimum(((+Vs−opamp·InputHeadroomV+)−RefV), (RefV−(−Vs+opamp·Input·HeadroomV−))). Output headroom (OutRoom) is the difference between the output voltage swing and the supply voltage and may be computed to be OutRoom=Minimum(((+Vs−opamp·OutputHeadroomV+)−RefV), (RefV−(−Vs+opamp·OutputHeadroom V+))).

Turning to FIG. 30, FIG. 30 is a simplified pseudo-code indicating example operations that may be associated with selecting resistor and capacitor values according to an embodiment of filter design tool 10. To determine the resistor and capacitor component values, target stage specifications (e.g., comprising order, $f_p$, Q, $f_z$, gain and type), optimization method (e.g., noise, power, voltage range, etc.), and op amp name may be input. The target stage specifications of a specific stage indicate the design goal for the specific stage. The outputs include appropriate values in Components Object 66, and actual stage specifications (e.g., comprising order, $f_p$, Q, $f_z$, gain and type with the specific components values).

According to algorithm 324, capacitor C1 and variable R3plusR4 may be set based on the stage's $f_p$, and user's optimization choice. Note that where R3 and R4 values are needed, in an example embodiment, if gain is greater than or equal to 1.0001, R3 may be set to (R3+R4)/gain; and R4 may be set to (R3+R4)−R3. If gain is less than 1.0001 and greater than 0.9999, R4 may be set to 0, and R3 may be set to ∞ (e.g., no resistor case). Gain may not be less than 1 when computing R3plusR4.

Op amp fields in Components Object 66 may be populated by pulling appropriate values from op amp database 54. If $R_{out}$ does not exist in the database, a proxy value of 0.3/supply current may be used instead. Variables Loopfp and LoopQ may be set to $f_p$ and Q, respectively, from the target stage specifications. If "Compensate for Op Amp" is selected (e.g., indicating that the user wishes to compensate for non-idealities of the op amp), the following operations may be executed several times (e.g., four, or more, or less, depending on particular needs); otherwise the following operations may be executed once.

For 1st order low pass and high pass filters, non-op amp fields (e.g., pertaining to resistor and capacitor values) may be computed assuming first order ideal op amp; for 2nd order low pass and high pass filters, non-op amp fields may be computed assuming Sallen-Key low pass and high pass ideal op amp, respectively; for 2nd order bandpass filter, non-op amp fields may be computed assuming Delyiannis Friend Bandpass ideal op amp; for 2nd order bandstop filter, non-op amp fields may be computed assuming Delyiannis Friend Notch ideal op amp. Component values limits may be imposed, and the actual $f_p$ and Q values may be calculated (e.g., using Nelder Mead algorithm).

The $f_p$ and Q values may be altered by the op amp's gain bandwidth in light of the actual $f_p$ and Q values of selected components. Loopfp and LoopQ values may be recalculated for the subsequent iteration (if more than one iterations is run). Loop values may be changed by an approximate ratio of the desired $f_p$ (and Q) to the actual $f_p$ (and Q), to prevent overshooting and ping ponging (non-convergence). Actual stage specifications may be set to the computed actual $f_p$ and Q values, and the $f_2$, gain and type values may be retained from the target stage specifications.

Turning to FIG. 31, FIG. 31 is a simplified diagram indicating example initial capacitor values (C1) according to an embodiment of filter design tool 10. The capacitor values are provided as a function of $f_p$. If optimization for power is selected, values provided in table 326 may be used. If optimization for voltage range is selected, values provided in table 328 may be used. Table 328 may also be used where optimization for specific components is selected. If optimization for noise is selected, values provided in table 330 may be used. If optimization for voltage range is selected, values provided in table 328 may be used.

Turning to FIG. 32, FIG. 32 is a simplified pseudo-code indicating example operations that may be associated with initial R3plusR4 values according to an embodiment of filter design tool 10. To compute initial R3plusR4 values, inputs are optimization parameters (e.g., noise, power, voltage range, etc.) and $f_p$; the output is R3plusR4. According to algorithm 334, variable $f_{max}$ may be set to 10 MHz. Variables R_at_f-max and Rmax may be set based on the optimization parameters according to table 336. Variable $R_{freq}$ may be calculated as:

$$R_{freq} = \sqrt{\frac{f_{max}}{f_p}} \times R\_at\_fmax$$

R3plusR4 may be calculated to be the minimum of $R_{freq}$ and Rmax.

Turning to FIG. 33, FIG. 33 is a simplified pseudo-code indicating example operations that may be associated with optimizing stage order according to an embodiment of filter design tool 10. Inputs to algorithm 340 may include the Component Array (e.g., array of Component Objects), Target Stage Specs, and Actual Stage Specs, frequency array, and optimization parameters. In an example embodiment, the Component Array, Target Stage Specs and Actual Stage Specs may be arrays of the same length. For example if 3 stages are used in the filter, then each of the arrays may include 3 objects therein. The outputs may include a new Component Array, New Target Stage Specs and New Actual Stage Specs (e.g., indicating a new order of the stages).

A frequency range may be computed with 50 frequency points therebetween (e.g., for ease of plotting the associated frequency response graph). Any number of frequency points may be used in the frequency range within the broad scope of the embodiments. According to example algorithm 340, frequency range may be computed using a start frequency ($f_{start}$), stop frequency ($f_{stop}$), points per decade=numfreqpoints*log ($f_{stop}/f_{start}$). Substantially all calculations from may use the array of frequency points calculated according to the above frequency range.

If the optimization parameter is noise, for each component stage permutation (e.g., $^3P_3$), spectral density may be calculated using any known method; and root mean square (RMS) noise for each stage may be calculated (e.g., RMS and peak to peak values) with bandwidth set to the maximum frequency in the frequency array. A new Component Array, Target Stage Specs, and Actual Stage Specs may be returned with stages rearranged in an order that provides the smallest RMSnoise value. If the optimization parameter is voltage range, a suitable multiplier may be calculated in the Voltage Range, and a new Component Array, Target Stage Specs, and Actual Stage Specs may be returned with stages rearranged in an order that provides the largest multiplier. In example embodiments, stage order rearrangements may not be available (or performed) for optimizations for low power or specific components.

Figure 34:
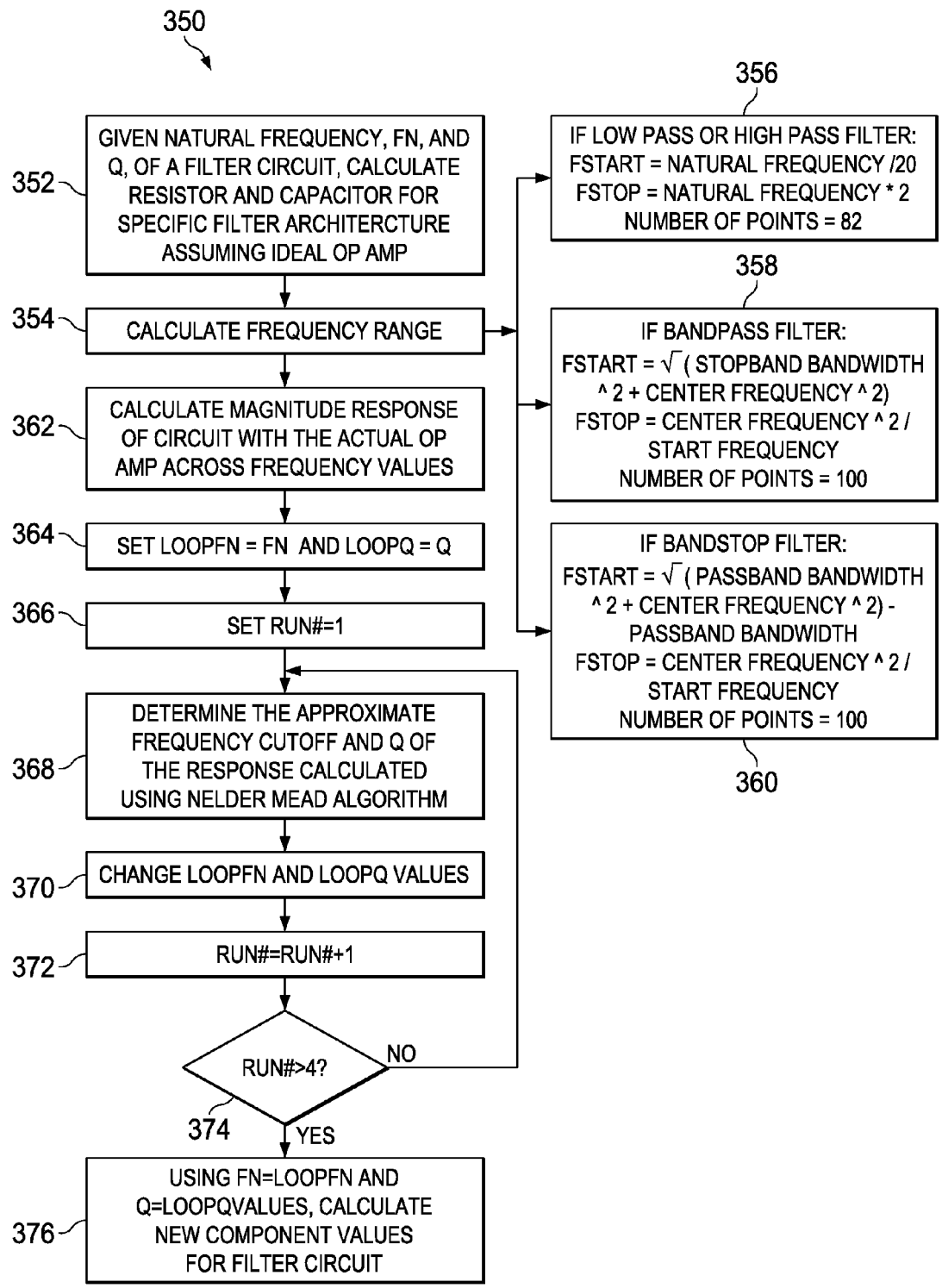
FIG. 34 is a simplified flow diagram illustrating yet other example operations that may be associated with an embodiment of the filter design tool.

Turning to FIG. 34, FIG. 34 is a simplified flow diagram illustrating example operations that may be associated with compensating for limited op amp GBW, according to an embodiment of filter design tool 10. Embodiments of filter design tool 10 may adjust the filter's passive component values to compensate for op amp non-idealities. The optimization technique may be helpful for op amps with barely enough gain bandwidth for the filter design (e.g., in design of a very high speed or very low power filter). By compensating for the op amp, a reasonably good filter response may be obtained, even with an otherwise "marginal" op amp.

Operations 350 may include 352, at which given a natural frequency, $f_n$, and Q, of a filter circuit, resistor and capacitor values may be calculated for the specific filter assuming an ideal op amp. At 354, a frequency range may be calculated. The calculations may depend on the specific filter type. For example, for low pass and high pass filters, at 356, the $f_{start}$ variable may be set to $f_n/20$, and $f_{stop}$ may be set to $f_n/2$, with the number of points therebetween set to 82. For bandpass filters, at 358, the number of points between the starting and stopping frequencies is set to 100, and $f_{start}$ and $f_{stop}$ are set to:

$$f_{start} = \sqrt{(\text{stopband\_bandwidth})^2 + (\text{center\_frequency})^2}$$

$$f_{stop} = \frac{(\text{center\_frequency})^2}{f_{start}}$$

For bandstop filters, at 360, the number of points between the starting and stopping frequencies is set to 100, and $f_{start}$ and $f_{stop}$ are set to:

$$f_{start} = \sqrt{(\text{passband\_bandwidth})^2 + (\text{center\_frequency})^2} - \text{passband\_bandwidth}$$

$$f_{stop} = \frac{(\text{center\_frequency})^2}{f_{start}}$$

At 362, a magnitude response of the filter with the actual op amp values across the frequency values may be calculated. At 364 variable LoopFn may be set to $f_n$ and LoopQ may be set to Q. At 366, a temporary variable Run# may be set to 1. At 368, the approximate frequency cutoff and Q of the response calculated using a suitable method (e.g., Nelder Mead algorithm) may be determined. At 370, the LoopFn and LoopQ variables may be changed:

$$LoopFn = \sqrt{\frac{\text{original\_f}_n}{\text{center\_of\_gravity\_f}_n}} \times LoopFn$$

$$LoopQ = \sqrt{\frac{\text{original\_Q}}{\text{center\_of\_gravity\_Q}}} \times LoopQ$$

The variables center_of_gravity_fn and center_of_gravity_Q can represent optimized values obtained from the optimization algorithm. At 372, temporary variable Run# may be incremented by 1. At 374, a determination may be made whether Run# is greater than 4 (or other suitable values, based on accuracy needs). If Run# is less than 4, operations loop back to 368, and repeats, until the iterations complete 4 cycles. At 376, $f_n$ may be set to the final computed value of LoopFn and Q may be set to the final computed value of LoopQ. New component values may be calculated based on the new $f_n$ and Q values.

Figure 35:
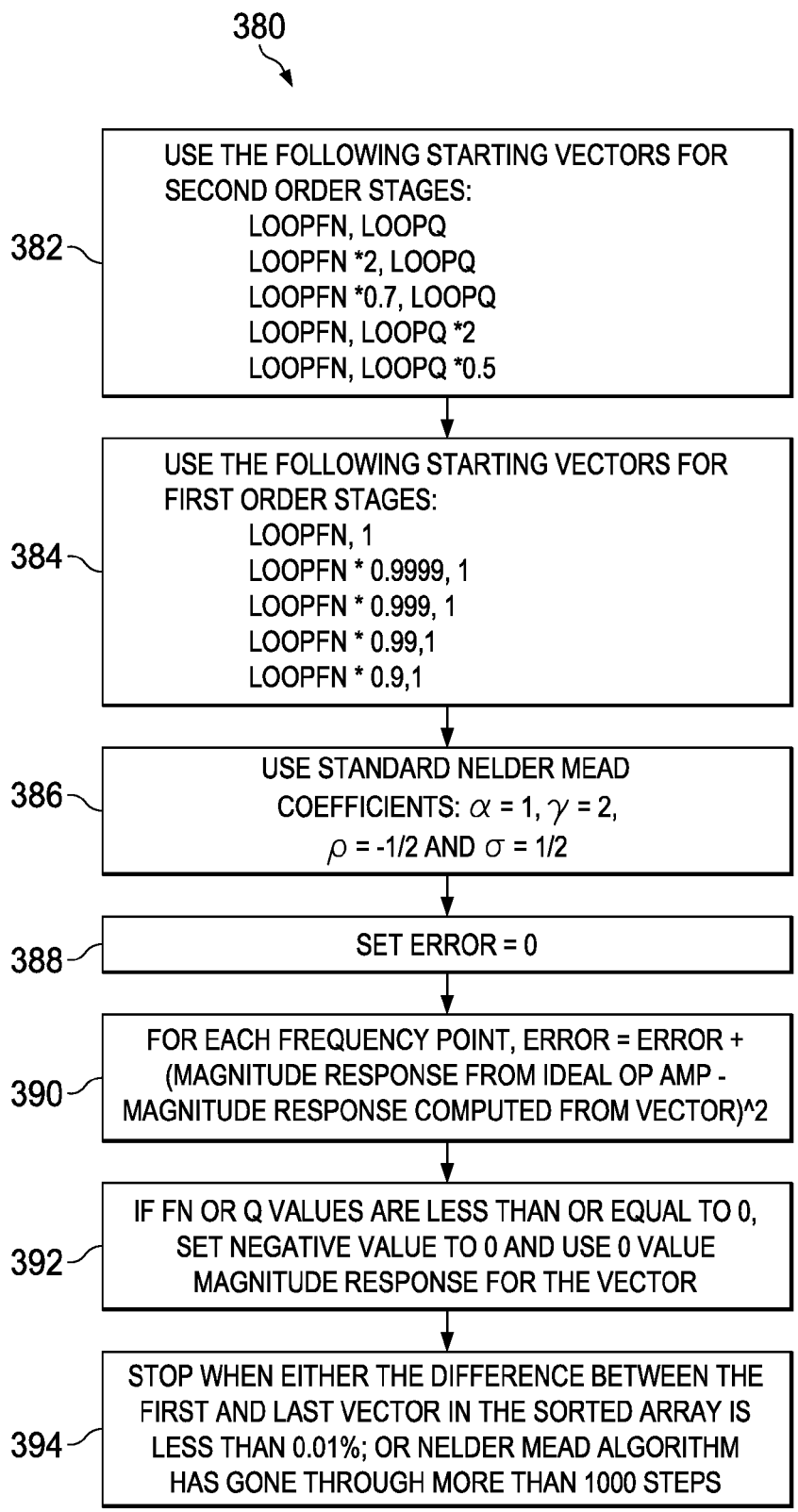
FIG. 35 is a simplified flow diagram illustrating yet other example operations that may be associated with an embodiment of the filter design tool.

Turning to FIG. 35, FIG. 35 is a simplified flow diagram illustrating example operations that may be associated with running Nelder Mead algorithms, according to an embodiment of filter design tool 10. The Nelder Mead method is a commonly used nonlinear optimization technique for twice differentiable problems. Any suitable optimization algorithm may be used in filter design tool 10 within the broad scope of the embodiments. Nelder Mead is merely one such optimization algorithm used as an example, and as such, should not be considered to be a limitation of filter design tool 10.

In general, the Nelder Mead method uses the concept of a simplex, which is a special polytope of N+1 vertices in N dimensions. Examples of simplices include a line segment on a line, a triangle on a plane, and a tetrahedron in three-dimensional space. The method approximates a local optimum of a problem with N variables when the objective function varies smoothly and is unimodal. Nelder Mead generates a new test position by extrapolating the behavior of the objective function measured at each test point arranged as a simplex. The algorithm chooses to replace one of these test points with the new test point and so on. The worst point may be replaced with a point reflected through the centroid of the remaining N points. If the replaced point is better than the best current point, then stretching exponentially out along the line may be performed. On the other hand, if the replaced point is not much better than the previous value, the simplex may be shrunk or contracted towards a better point.

Operations 380 may implement the Nelder Mead algorithm and include 382, at which the following starting vectors may be used for 2nd order stages: {LoopFn, LoopQ}; {LoopFn×2, LoopQ}; {LoopFn×0.7, LoopQ}; {LoopFn, LoopQ×2}; and {LoopFn, LoopQ×0.5}. At 384, the following starting vectors may be used for 1st order stages (Q is assumed to be 1): {LoopFn, 1}; {LoopFn×0.9999, 1}; {LoopFn×0.999, 1}; {LoopFn×0.99, 1}; and {LoopFn×0.9, 1}. At 386, standard Nelder Mead coefficients may be used as follows: $\alpha=1$, $\gamma=2$, $\rho=-\frac{1}{2}$, and $6=\frac{1}{2}$, where $\alpha$, $\gamma$, $\rho$, and $\sigma$ are respectively, the reflection, expansion, contraction and shrink coefficients. Any other suitable values may also be used for the Nelder Mead coefficients within the broad scope of the embodiments.

At 388, error may be set to 0. At 390, for each frequency point (e.g., on a response graph), error may be computed to be the previously calculated error plus (magnitude response from ideal op amp−magnitude response computed from Nelder Mead algorithm)^2. At 392, if $f_n$ or Q values are less than or equal to 0, the values may be reset to 0, and magnitude response for the vector may be set to 0. At 394, when either the difference between the first and last vector in the sorted array is less than 0.01%, or Nelder Mead algorithm has gone through more than 1000 steps, the error calculations may be stopped.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Furthermore, the words "optimize," "optimization," and related terms are terms of art that refer to improvements in speed and/or efficiency of a specified outcome and do not purport to indicate that a process for achieving the specified outcome has achieved, or is capable of achieving, an "optimal" or perfectly speedy/perfectly efficient state.

In example implementations, at least some portions of the activities outlined herein may be implemented in software in, for example, filter design module 20. In some embodiments, one or more of these features may be implemented in hardware, provided external to these elements, or consolidated in any appropriate manner to achieve the intended functionality. The various elements (e.g., filter design module 20, user interface 12) may include software (or reciprocating software) that can coordinate in order to achieve the operations as outlined herein. In still other embodiments, these elements may include any suitable algorithms, hardware, software, components, modules, interfaces, or objects that facilitate the operations thereof.

Furthermore, filter design tool 10 described and shown herein (and/or their associated structures) may also include suitable interfaces for receiving, transmitting, and/or otherwise communicating data or information to hardware components (e.g., computer monitors, display devices) and network devices (e.g., client devices) in a network environment. Additionally, some of the processors and memory elements associated with the various nodes may be removed, or otherwise consolidated such that a single processor and a single memory element are responsible for certain activities. In a general sense, the arrangements depicted in the FIGURES may be more logical in their representations, whereas a physical architecture may include various permutations, combinations, and/or hybrids of these elements. It is imperative to note that countless possible design configurations can be used to achieve the operational objectives outlined here. Accordingly, the associated infrastructure has a myriad of substitute arrangements, design choices, device possibilities, hardware configurations, software implementations, equipment options, etc.

In some of example embodiments, one or more memory elements (e.g., memory element 58, op amp database 54) can store data used for the operations described herein. This includes the memory element being able to store instructions (e.g., software, logic, code, etc.) in non-transitory media, such that the instructions are executed to carry out the activities described in this Specification. A processor can execute any type of instructions associated with the data to achieve the operations detailed herein in this Specification.

In one example, processors (e.g., processor 56) could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

In operation, components in filter design tool 10 can include one or more memory elements (e.g., memory element 58, op amp database 54) for storing information to be used in achieving operations as outlined herein. These devices may further keep information in any suitable type of non-transitory storage medium (e.g., random access memory (RAM), read only memory (ROM), field programmable gate array (FPGA), EPROM, EEPROM, etc.), software, hardware, or in any other suitable component, device, element, or object where appropriate and based on particular needs. The information being tracked, sent, received, or stored in filter design tool 10 could be provided in any database, register, table, cache, queue, control list, or storage structure, based on particular needs and implementations, all of which could be referenced in any suitable timeframe. Any of the memory items discussed herein should be construed as being encompassed within the broad term 'memory element.' Similarly, any of the potential processing elements, modules, and machines described in this Specification should be construed as being encompassed within the broad term 'processor.'

It is also important to note that the operations and steps described with reference to the preceding FIGURES illustrate only some of the possible scenarios that may be executed by, or within, the system. Some of these operations may be deleted or removed where appropriate, or these steps may be modified or changed considerably without departing from the scope of the discussed concepts. In addition, the timing of these operations may be altered considerably and still achieve the results taught in this disclosure. The preceding operational flows have been offered for purposes of example and discussion. Substantial flexibility is provided by the system in that any suitable arrangements, chronologies, configurations, and timing mechanisms may be provided without departing from the teachings of the discussed concepts.

Although the present disclosure has been described in detail with reference to particular arrangements and configurations, these example configurations and arrangements may be changed significantly without departing from the scope of the present disclosure. For example, although the present disclosure has been described with reference to particular optimization algorithms and certain user interface configurations, filter design tool 10 may be applicable to other algorithms or user interface configurations. Moreover, although filter design tool 10 has been illustrated with reference to particular elements and operations that facilitate the computation and display processes, these elements, and operations may be replaced by any suitable architecture or process that achieves the intended functionality of filter design tool 10.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A method implemented by a filter design tool on a computing device, comprising:
   receiving filter parameters for an analog filter through a user interface, wherein the filter parameters include at least one optimization parameter related to an application requirement of the analog filter, wherein the user interface includes an input area, a viewing area and a window area in one or more pages, and wherein the input area is contiguous to the viewing area in at least one page to be rendered on the user interface;
   optimizing the filter for the at least one optimization parameter;
   compensating for non-idealities of an operational amplifier in the filter;
   calculating a design output based on the filter that was optimized and compensated; and
   displaying the design output on the user interface, wherein the filter parameters can be entered in the input area and the design output is calculated and displayed in the contiguous viewing area in a substantially immediate manner.

2. The method of claim 1, wherein the user interface is configured to be navigable across the one or more pages according to a filter design process, comprising:
   selecting a filter type;
   selecting performance constraints and a filter response type;
   specifying the at least one optimization parameter; and
   specifying a component tolerance.

3. The method of claim 1, wherein when a first page comprising a step in a filter design process is displayed as an active page in the user interface, a second page comprising a previous step in the filter design process can be selected to be as rendered the active page, and a third page comprising a subsequent step in the filter design process cannot be selected to be rendered as the active page before completing the step in the first page.

4. The method of claim 1, wherein the window area can overlap with the input area and the viewing area, and wherein the window area is configured to display text, alerts, and errors.

5. The method of claim 1, wherein the filter parameters further comprise a selected one of a group of parameters, the group consisting of:
   a) a type of filter;
   b) a filter response type and corresponding plurality of performance constraints;
   c) voltage supplies for operational amplifiers (op amps) in the filter; and
   d) one or more component tolerances.

6. The method of claim 5, wherein the filter response type can be specified through a slider control having at least three selectable points corresponding to three different filter response types.

7. The method of claim 1, further comprising receiving viewing parameters through the user interface, wherein the viewing parameters specify the design output to be displayed.

8. The method of claim 7, wherein the viewing parameters further comprise a selected one of a group of parameters, the group consisting of:
   a) a magnitude of a frequency response of the filter;
   b) a phase of the frequency response;
   c) a step response of the filter;
   d) a stage characteristic;
   e) a circuit schematic;
   f) a noise characteristic;
   g) a power characteristic;
   h) a voltage range;
   i) a group delay;
   j) a phase delay;
   k) poles and zeroes; and
   l) an impulse response.

9. Non-transitory computer readable media that includes instructions for execution, which when executed by a processor, is operable to perform operations comprising:
   receiving filter parameters for an analog filter through a user interface, wherein the filter parameters include at least one optimization parameter related to an application requirement of the analog filter, wherein the user interface includes an input area, a viewing area and a window area in one or more pages, and wherein the input area is contiguous to the viewing area in at least one page to be rendered on the user interface;
   optimizing the filter for the at least one optimization parameter;
   compensating for non-idealities of an operational amplifier in the filter;
   calculating a design output based on the filter that was optimized and compensated; and
   displaying the design output on the user interface, wherein the filter parameters can be entered in the input area and the design output is calculated and displayed in the contiguous viewing area in a substantially immediate manner.

10. The media of claim 9, wherein the user interface is configured to be navigable across the one or more pages according to a filter design process, comprising:
   selecting a filter type;
   selecting performance constraints and a filter response type;
   specifying the at least one optimization parameter; and
   specifying a component tolerance.

11. The media of claim 9, wherein when a first page comprising a step in a filter design process is displayed as an active page in the user interface, a second page comprising a previous step in the filter design process can be selected to be as rendered the active page, and a third page comprising a subsequent step in the filter design process cannot be selected to be rendered as the active page before completing the step in the first page.

12. An apparatus, comprising:
   a memory element for storing data; and
   a processor operable to execute instructions associated with the data, wherein the processor and the memory element cooperate such that the apparatus is configured for:
      receiving filter parameters for an analog filter through a user interface, wherein the filter parameters include at least one optimization parameter related to an application requirement of the analog filter, wherein the user interface includes an input area, a viewing area and a window area in one or more pages, and wherein the input area is contiguous to the viewing area in at least one page to be rendered on the user interface;
      optimizing the filter for the at least one optimization parameter;
      compensating for non-idealities of an operational amplifier in the filter;
      calculating a design output based on the filter that was optimized and compensated; and
      displaying the design output on the user interface, wherein the filter parameters can be entered in the input area and the design output is calculated and displayed in the contiguous viewing area in a substantially immediate manner.

13. The apparatus of claim 12, wherein the user interface is configured to be navigable across the one or more pages according to a filter design process, comprising:
   selecting a filter type;
   selecting performance constraints and a filter response type;
   specifying the at least one optimization parameter; and
   specifying a component tolerance.

14. The apparatus of claim 12, wherein when a first page comprising a step in a filter design process is displayed as an active page in the user interface, a second page comprising a previous step in the filter design process can be selected to be as rendered the active page, and a third page comprising a subsequent step in the filter design process cannot be selected to be rendered as the active page before completing the step in the first page.

* * * * *